United States Patent
Cheng

(10) Patent No.: US 11,913,725 B2
(45) Date of Patent: Feb. 27, 2024

(54) HEAT DISSIPATION DEVICE HAVING IRREGULAR SHAPE

(71) Applicant: COOLER MASTER CO., LTD., New Taipei (TW)

(72) Inventor: Jen-Chih Cheng, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 201 days.

(21) Appl. No.: 16/711,233

(22) Filed: Dec. 11, 2019

(65) Prior Publication Data

US 2020/0200486 A1 Jun. 25, 2020

Related U.S. Application Data

(60) Provisional application No. 62/798,480, filed on Jan. 30, 2019, provisional application No. 62/783,717, filed on Dec. 21, 2018.

(51) Int. Cl.
   *F28D 15/00* (2006.01)
   *F28D 15/04* (2006.01)

(52) U.S. Cl.
   CPC .................. *F28D 15/043* (2013.01)

(58) Field of Classification Search
   CPC ....... F28D 15/04; F28D 15/043; F28D 15/046
   See application file for complete search history.

(56) References Cited

U.S. PATENT DOCUMENTS

| | | |
|---|---|---|
| 2,827,774 A | 3/1958 | Dunkelman |
| 3,255,702 A | 6/1966 | Gehrm |
| 3,746,081 A | 7/1973 | Corman et al. |
| 3,757,856 A | 9/1973 | Kun |
| 3,913,664 A * | 10/1975 | Roukis ............... F28D 15/046 165/104.26 |
| 4,019,571 A * | 4/1977 | Kosson ............... F28D 15/046 165/104.26 |
| 4,058,160 A | 11/1977 | Corman et al. |
| 4,116,266 A | 9/1978 | Sawata et al. |
| 4,118,756 A | 10/1978 | Nelson et al. |

(Continued)

FOREIGN PATENT DOCUMENTS

| | | |
|---|---|---|
| CN | 100470776 C | 3/2009 |
| JP | 2000-161878 A | 6/2000 |

(Continued)

OTHER PUBLICATIONS

Final Office Acton issued in corresponding U.S. Appl. No. 16/119,707, dated May 18, 2021.
Non-Final Office Action dated Nov. 5, 2020 in U.S. Appl. No. 16/422,562.
Chapter 5: Heat Pipe Manufacturing—Bahman Zohuri (Apr. 2016) (Year: 2016).
Non-Final Office Action dated Nov. 12, 2020 in U.S. Appl. No. 16/119,707.

(Continued)

*Primary Examiner* — Travis Ruby
(74) *Attorney, Agent, or Firm* — McDermott Will & Emery LLP

(57) ABSTRACT

A heat dissipation device includes a first casing and a second casing coupled to the first casing. The second casing includes a body having an inner surface and an outer surface opposite the inner surface, and a first portion and a second portion, each of the first and second portions having a different cross-sectional area. The heat dissipation device further includes a plurality of columns on the inner surface, and a first wick structure disposed on the inner surface and in the first portion and the second portion.

9 Claims, 19 Drawing Sheets

(56) References Cited

U.S. PATENT DOCUMENTS

| | | | |
|---|---|---|---|
| 4,148,204 A | 4/1979 | Dotzer et al. | |
| 4,166,266 A | 8/1979 | Kozacka et al. | |
| 4,253,636 A | 3/1981 | Grady et al. | |
| 4,523,636 A * | 6/1985 | Meijer | F28D 15/0233 122/366 |
| 4,604,460 A | 8/1986 | Yoshioka et al. | |
| 4,770,238 A | 9/1988 | Owen | |
| 5,125,454 A | 6/1992 | Creamer et al. | |
| 5,176,205 A | 1/1993 | Anthony | |
| 5,377,901 A | 1/1995 | Rungta et al. | |
| 5,465,782 A | 11/1995 | Sun et al. | |
| 6,148,906 A * | 11/2000 | Li | F28D 15/0233 165/104.26 |
| 6,269,866 B1 * | 8/2001 | Yamamoto | F28D 15/0233 165/104.26 |
| 6,302,192 B1 | 10/2001 | Dussinger et al. | |
| 6,382,309 B1 | 5/2002 | Kroliczek et al. | |
| 6,427,765 B1 * | 8/2002 | Han | F28D 15/046 165/104.26 |
| 6,604,669 B1 | 8/2003 | Syslak et al. | |
| 6,738,257 B1 | 5/2004 | Lai | |
| 6,745,825 B1 * | 6/2004 | Nakamura | F28D 15/0233 165/104.26 |
| 6,782,942 B1 * | 8/2004 | Wang | F28D 15/0233 165/104.26 |
| 6,796,373 B1 | 9/2004 | Li | |
| 6,938,680 B2 | 9/2005 | Garner et al. | |
| 7,048,175 B2 | 5/2006 | Runyan | |
| 7,249,627 B2 | 7/2007 | Choi et al. | |
| 7,275,588 B2 | 10/2007 | Hsu | |
| 7,278,469 B2 | 10/2007 | Sasaki et al. | |
| 7,337,941 B2 | 3/2008 | Scott et al. | |
| 7,443,677 B1 | 10/2008 | Zhou et al. | |
| 7,543,630 B2 | 6/2009 | Lai et al. | |
| 7,845,394 B2 | 12/2010 | Chang et al. | |
| 7,857,037 B2 | 12/2010 | Parish et al. | |
| 8,256,501 B2 | 9/2012 | Nagai et al. | |
| 8,341,968 B2 | 1/2013 | Landers et al. | |
| 8,720,062 B2 | 5/2014 | He et al. | |
| 8,780,559 B2 | 7/2014 | Weaver, Jr. et al. | |
| 8,811,014 B2 | 8/2014 | Chauhan et al. | |
| 8,919,426 B2 | 12/2014 | Hardesty | |
| 9,291,398 B2 | 3/2016 | Yang et al. | |
| 9,453,668 B2 | 9/2016 | Higashiiue et al. | |
| 9,685,393 B2 | 6/2017 | Qiu et al. | |
| 9,897,392 B2 | 2/2018 | Wang | |
| 10,048,015 B1 | 8/2018 | Lin | |
| 10,112,272 B2 | 10/2018 | Yang et al. | |
| 10,145,619 B2 | 12/2018 | Huang et al. | |
| 10,727,149 B2 | 7/2020 | Tong et al. | |
| 10,907,907 B2 | 2/2021 | Wang et al. | |
| 2001/0047859 A1 | 12/2001 | Ishida et al. | |
| 2002/0179288 A1 | 12/2002 | Ishida et al. | |
| 2003/0010477 A1 | 1/2003 | Khrustalev et al. | |
| 2003/0173068 A1 | 9/2003 | Davies et al. | |
| 2004/0067414 A1 | 4/2004 | Wei et al. | |
| 2004/0069455 A1 * | 4/2004 | Lindemuth | B22F 7/004 165/104.15 |
| 2004/0118553 A1 | 6/2004 | Krassowski et al. | |
| 2005/0092465 A1 | 5/2005 | Lin et al. | |
| 2005/0173098 A1 | 8/2005 | Connors | |
| 2005/0178532 A1 | 8/2005 | Meng-Cheng et al. | |
| 2006/0098411 A1 * | 5/2006 | Lee | F28D 15/0233 361/704 |
| 2006/0144571 A1 | 7/2006 | Lin et al. | |
| 2006/0162905 A1 | 7/2006 | Hsu | |
| 2007/0006993 A1 | 1/2007 | Meng et al. | |
| 2007/0022603 A1 | 2/2007 | Chuang et al. | |
| 2007/0193723 A1 | 8/2007 | Hou et al. | |
| 2007/0240855 A1 | 10/2007 | Hou et al. | |
| 2007/0272399 A1 | 11/2007 | Nitta et al. | |
| 2007/0277962 A1 | 12/2007 | Jylhakallio | |
| 2007/0295486 A1 * | 12/2007 | Su | F28D 15/0233 165/104.26 |
| 2008/0036076 A1 | 2/2008 | Ouyang | |
| 2008/0078531 A1 | 4/2008 | Chung et al. | |
| 2008/0080133 A1 * | 4/2008 | Yang | H05K 7/20336 361/688 |
| 2008/0144319 A1 | 6/2008 | Chang et al. | |
| 2009/0004902 A1 | 1/2009 | Pandey et al. | |
| 2009/0025910 A1 | 1/2009 | Hoffman et al. | |
| 2009/0040726 A1 | 2/2009 | Hoffman et al. | |
| 2009/0084526 A1 | 4/2009 | Chang et al. | |
| 2009/0101308 A1 | 4/2009 | Hardesty | |
| 2009/0250196 A1 | 10/2009 | Batty et al. | |
| 2010/0051239 A1 | 3/2010 | Lin et al. | |
| 2010/0065255 A1 | 3/2010 | Liu et al. | |
| 2010/0071879 A1 * | 3/2010 | Hou | F28D 15/046 165/104.26 |
| 2010/0075659 A1 | 3/2010 | Kim et al. | |
| 2010/0108297 A1 | 5/2010 | Chen | |
| 2010/0149755 A1 | 6/2010 | Tomioka et al. | |
| 2010/0155032 A1 * | 6/2010 | Wu | F28D 15/0233 165/104.26 |
| 2010/0266864 A1 | 10/2010 | Lee | |
| 2010/0319882 A1 | 12/2010 | Lee et al. | |
| 2010/0326629 A1 | 12/2010 | Meyer, IV et al. | |
| 2011/0000649 A1 | 1/2011 | Joshi et al. | |
| 2011/0030921 A1 | 2/2011 | Zhang et al. | |
| 2011/0088877 A1 | 4/2011 | Oniki et al. | |
| 2011/0100608 A1 * | 5/2011 | Huang | F28D 15/046 165/104.26 |
| 2011/0174464 A1 | 7/2011 | Liu et al. | |
| 2011/0220328 A1 | 9/2011 | Huang et al. | |
| 2012/0048516 A1 | 3/2012 | He et al. | |
| 2012/0111541 A1 | 5/2012 | Yan et al. | |
| 2012/0305222 A1 | 12/2012 | Yang et al. | |
| 2013/0025829 A1 * | 1/2013 | Huang | F28D 15/0233 165/104.26 |
| 2013/0037242 A1 * | 2/2013 | Chen | F28D 15/0233 165/104.26 |
| 2013/0092359 A1 | 4/2013 | Von Eckermann et al. | |
| 2013/0105131 A1 | 5/2013 | Chen et al. | |
| 2013/0126139 A1 | 5/2013 | Tsuruta et al. | |
| 2013/0168050 A1 | 7/2013 | Chauhan et al. | |
| 2013/0174966 A1 | 7/2013 | He et al. | |
| 2013/0174996 A1 | 7/2013 | Chaudhry et al. | |
| 2013/0233518 A1 | 9/2013 | Liu et al. | |
| 2013/0340978 A1 | 12/2013 | Agostini et al. | |
| 2014/0102671 A1 | 4/2014 | Dai et al. | |
| 2014/0131013 A1 * | 5/2014 | Horng | F28D 15/046 165/104.26 |
| 2014/0182819 A1 | 7/2014 | Yang | |
| 2014/0311713 A1 | 10/2014 | Wu et al. | |
| 2014/0345832 A1 * | 11/2014 | Lin | F28D 15/046 165/104.26 |
| 2015/0026981 A1 | 1/2015 | Yang | |
| 2015/0041103 A1 | 2/2015 | Kiley et al. | |
| 2015/0083372 A1 | 3/2015 | Yang | |
| 2015/0101784 A1 | 4/2015 | Pai | |
| 2015/0198376 A1 * | 7/2015 | Pai | F28D 15/0233 165/104.26 |
| 2015/0198378 A1 * | 7/2015 | Pai | F28D 15/0233 165/104.26 |
| 2015/0204617 A1 | 7/2015 | Thanhlong et al. | |
| 2016/0003555 A1 | 1/2016 | Sun et al. | |
| 2016/0018166 A1 | 1/2016 | Ahamed et al. | |
| 2016/0069616 A1 * | 3/2016 | Shen | F28D 15/046 165/104.26 |
| 2016/0123679 A1 * | 5/2016 | Chiu | F28D 15/046 165/104.26 |
| 2016/0343639 A1 * | 11/2016 | Groothuis | F28D 15/043 |
| 2016/0348985 A1 | 12/2016 | Sun et al. | |
| 2017/0082378 A1 | 3/2017 | Wang et al. | |
| 2017/0122672 A1 | 5/2017 | Lin | |
| 2017/0153066 A1 | 6/2017 | Lin et al. | |
| 2017/0176112 A1 | 6/2017 | Sarraf et al. | |
| 2017/0227298 A1 | 8/2017 | Sun et al. | |
| 2017/0241717 A1 | 8/2017 | Sun et al. | |
| 2017/0292793 A1 | 10/2017 | Sun et al. | |
| 2017/0303441 A1 | 10/2017 | Farshchian et al. | |
| 2017/0312871 A1 | 11/2017 | Lin | |

(56) References Cited

U.S. PATENT DOCUMENTS

| | | | |
|---|---|---|---|
| 2017/0343297 | A1 | 11/2017 | Lan |
| 2017/0350657 | A1 | 12/2017 | Yeh et al. |
| 2017/0356694 | A1 | 12/2017 | Tan et al. |
| 2018/0023416 | A1 | 1/2018 | Riaz et al. |
| 2018/0066896 | A1 | 3/2018 | Lin |
| 2018/0106552 | A1 | 4/2018 | Lin |
| 2018/0320997 | A1* | 11/2018 | He ............. F28D 15/0283 |
| 2018/0350718 | A1 | 12/2018 | Lin |
| 2018/0369971 | A1 | 12/2018 | Chiang et al. |
| 2019/0027424 | A1 | 1/2019 | Mira et al. |
| 2019/0033006 | A1* | 1/2019 | Vanderwees ......... H01L 23/427 |
| 2019/0049190 | A1 | 2/2019 | Liu et al. |
| 2019/0113288 | A1 | 4/2019 | Cheng |
| 2019/0195567 | A1 | 6/2019 | Wang et al. |
| 2019/0310030 | A1 | 10/2019 | Disori et al. |
| 2019/0339020 | A1* | 11/2019 | Tseng ............. F28D 15/046 |
| 2020/0221605 | A1* | 7/2020 | Vanderwees ........... G06F 1/203 |
| 2020/0393069 | A1 | 12/2020 | Sachdev et al. |
| 2021/0222964 | A1 | 7/2021 | Cheng |

FOREIGN PATENT DOCUMENTS

| | | | | |
|---|---|---|---|---|
| JP | 2001208489 | A * | 8/2001 | ......... F28D 15/046 |
| JP | 2004-251544 | A | 9/2004 | |
| JP | 2004-309002 | A | 11/2004 | |
| JP | 2007-150013 | A | 6/2007 | |
| JP | 2007-266153 | A | 10/2007 | |
| TW | M577538 | | 2/2004 | |
| TW | M517314 | U | 2/2016 | |
| TW | 201623901 | A | 7/2016 | |
| TW | I639379 | B | 10/2018 | |
| WO | 2011/130748 | A1 | 10/2011 | |
| WO | WO-2017104819 | A1 * | 6/2017 | ............ F28D 15/02 |
| WO | 2017195254 | A1 | 11/2017 | |

OTHER PUBLICATIONS

Non-Final Office Action issued in related U.S. Appl. No. 16/654,953, dated Aug. 2, 2021.
Non-Final Office Action issued in corresponding U.S. Appl. No. 16/422,562, dated Jul. 2, 2021.
Non-Final Office Action dated May 13, 2014 in U.S. Appl. No. 13/417,898.
Final Office Action dated Jul. 27, 2018 in U.S. Appl. No. 13/417,898.
Non-Final Office Action dated Feb. 7, 2019 in U.S. Appl. No. 13/417,898.
Final Office Action dated Aug. 22, 2019 in U.S. Appl. No. 13/417,898.
Notice of Allowance dated Nov. 15, 2019 in U.S. Appl. No. 13/417,898.
Non-Final Office Action dated Mar. 2, 2020 in U.S. Appl. No. 16/119,707.
Final Office Action dated Jul. 7, 2020 in U.S. Appl. No. 16/119,707.
Notice of Allowance dated Feb. 27, 2019 in U.S. Appl. No. 16/159,398.
Final Office Action dated Mar. 9, 2021 in U.S. Appl. No. 16/422,562.
Final Office Action dated Sep. 8, 2021 in U.S. Appl. No. 16/422,562.
Non-Final Office Action dated Sep. 28, 2020 in U.S. Appl. No. 16/654,953.
Final Office Action dated Mar. 24, 2021 in U.S. Appl. No. 16/654,953.
Non-Final Office Action dated Sep. 24, 2020 in U.S. Appl. No. 16/789,183.
Final Office Action dated Mar. 30, 2021 in U.S. Appl. No. 16/789,183.
Non-Final Office Action dated Aug. 5, 2021 in U.S. Appl. No. 16/789,183.
Notice of Allowance dated Feb. 7, 2022 in U.S. Appl. No. 16/119,707.
Final Office Action dated Feb. 14, 2022 in U.S. Appl. No. 16/654,953.
Final Office Action dated Jan. 18, 2022 in U.S. Appl. No. 16/789,183.
Non-Final Office Action issued in U.S. Appl. No. 16/119,707, dated Sep. 27, 2021.

* cited by examiner

HEAT DISSIPATION DEVICE HAVING IRREGULAR SHAPE

CROSS REFERENCE TO RELATED APPLICATIONS

This non-provisional application claims priority under 35 U.S.C. § 119 to U.S. Provisional patent application Nos. 62/783,717 filed Dec. 21, 2018, and 62/798,480 filed Jan. 30, 2019, the entire contents of both these applications are incorporated herein by reference.

BACKGROUND

Vapor chambers have higher efficiency in heat dissipation than heat pipes. A vapor chamber includes a casing and a wick structure. The casing defines a chamber for accommodating cooling fluid. The wick structure is disposed in the chamber. The casing has an evaporation section for absorbing heat and a condensation section for dissipating heat. The cooling fluid is evaporated into a gaseous state in the evaporation section, and then turns into a liquid state in the condensation section and is carried back to the section area by the wick structure, thereby creating circulating cooling fluid.

Electronic products have become lighter, slimmer, and more compact, and, as a result, vapor chambers are required to have an irregular shape in order to not interfere or obstruct nearby electrical components. In such a case, portions of the vapor chamber are required to have reduced dimensions, and the cross-sectional area of the wick structure in these portions is reduced compared to its cross-sectional area in other portions of the vapor chamber. In a vertically orientated vapor chamber, when a heat source is in thermal contact with the upper portion of the vapor chamber, cooling fluid in the vapor chamber is required to circulate against gravity. However, the flow of the cooling fluid stagnates in the reduced dimension portions due to the smaller cross-sectional area of the wick structure in these portions. Thus, the flow of the cooling liquid is restricted through the narrow area and circulation of the cooling fluid in the vapor chamber is inhibited, thereby affecting the operation of the vapor chamber.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
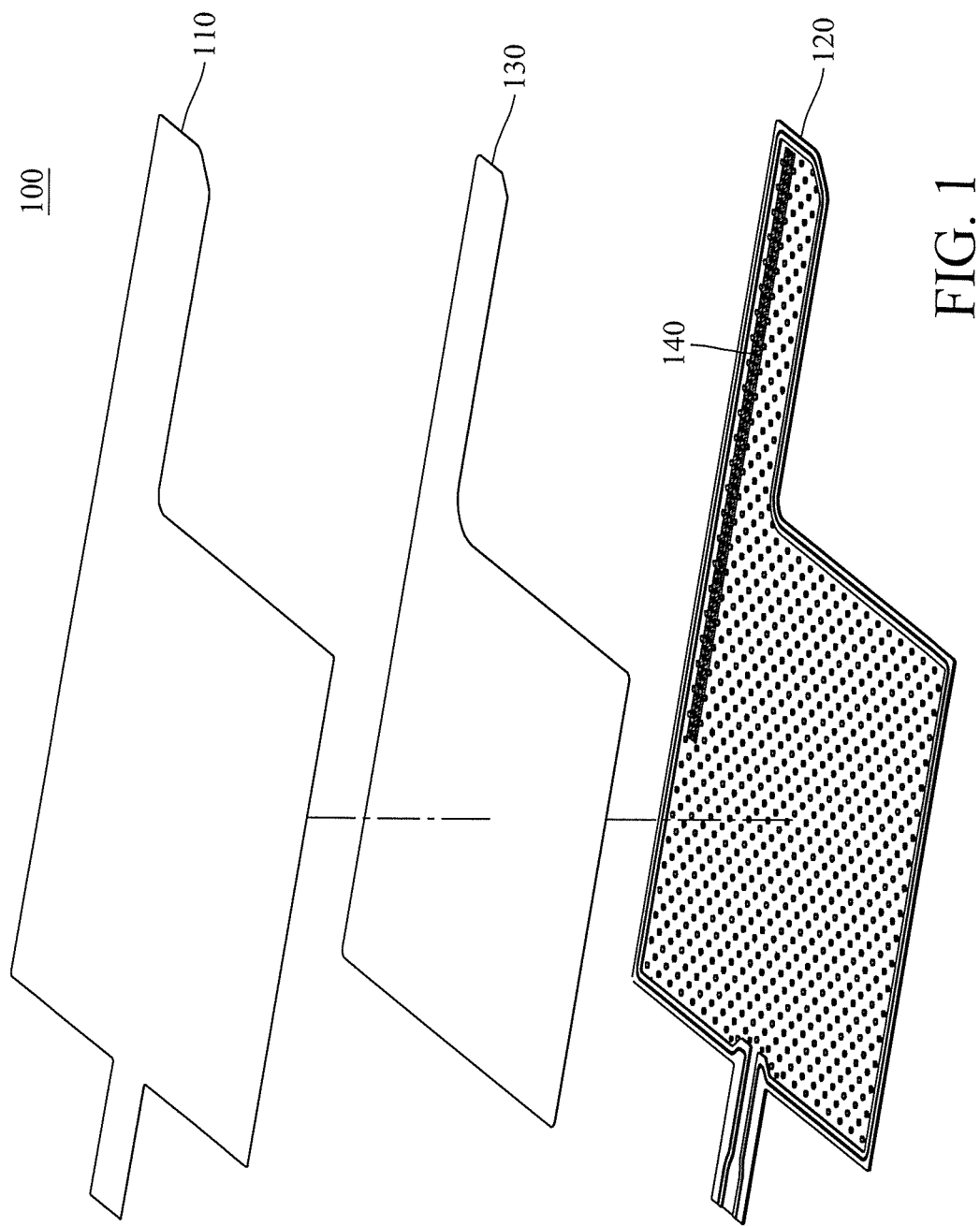
FIG. 1 is an exploded view of a vapor chamber according to embodiments of the disclosure.
Figure 2A:
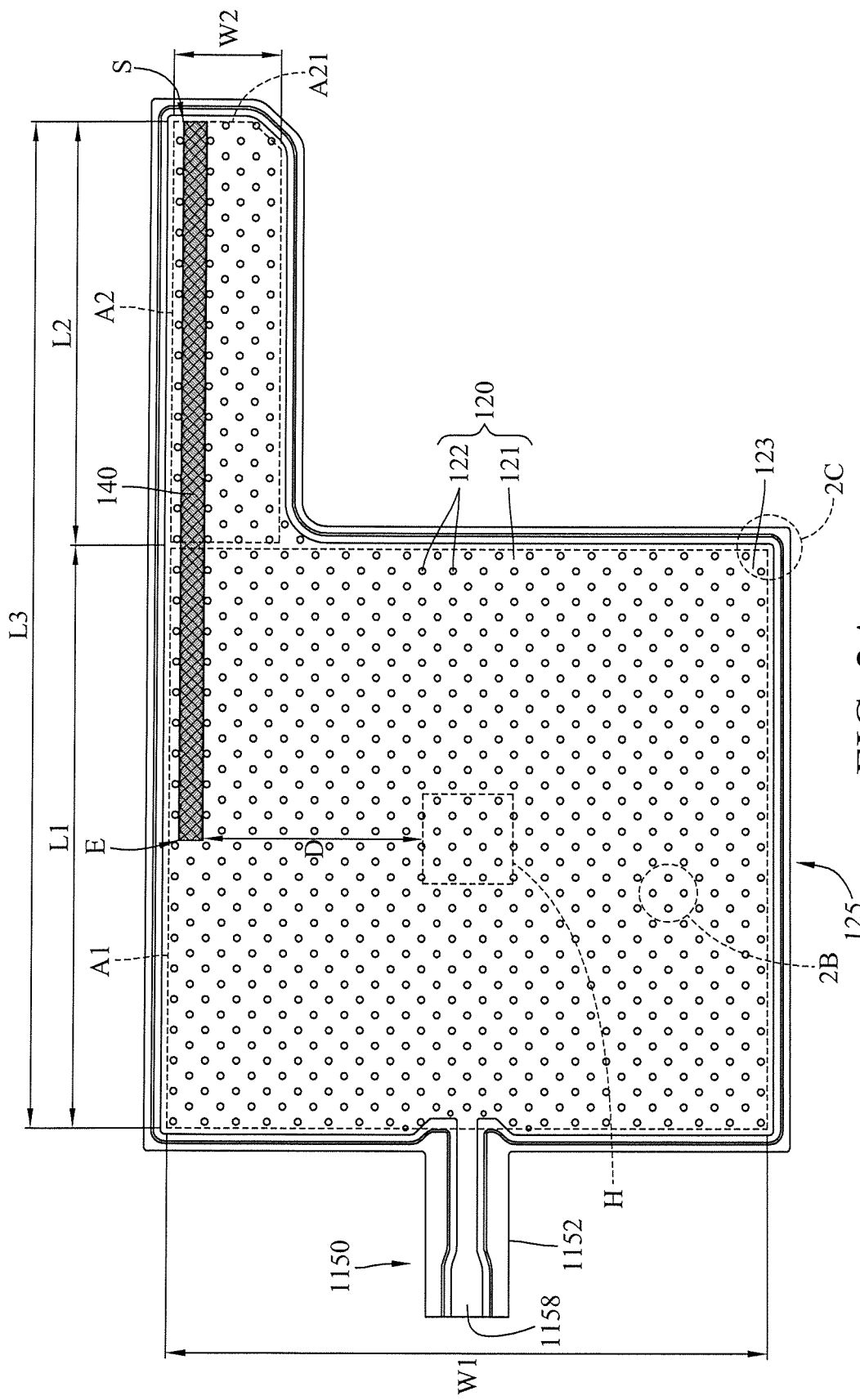
FIG. 2A is a plan view of a second casing of the heat dissipation device in FIG. 1, according to embodiments of the disclosure.

FIG. 1 is an exploded view of a heat dissipation device 100 according to embodiments of the disclosure. FIG. 2A is a plan view of a second casing 120 of the heat dissipation device 100 in FIG. 1, according to embodiments of the disclosure. For the purposes of discussion herein, the heat dissipation device 100 is considered to be a vapor chamber. However, embodiments are not limited thereto and embodiments disclosed herein are equally applicable to other types of heat dissipation devices without departing from the scope of the disclosure.

Referring to FIGS. 1 and 2A, the vapor chamber 100 is a generally flat, planar structure including a first casing 110, a second casing 120, a first wick structure 130, and a second wick structure 140. The vapor chamber 100 is referred to as a thin heat spreader. The vapor chamber 100 has a thickness less than approximately 1 millimeter.

The first casing 110 and the second casing 120 may be composed of, for example, oxygen-free copper, silicon-containing copper alloy, aluminum-containing copper alloy, a combination thereof, and the like. Referring to FIG. 2A, the second casing 120 includes a main body 121 and a plurality of supporting structures 122. The supporting structures 122 protrude (or otherwise project) from an inner surface 123 of the main body 121 towards the first casing 110 and contact the first casing 110. The supporting structures 122 reduce buckling of the first casing 110 and the second casing 120 and thus limit deformation of the vapor chamber 100. In some embodiments, the supporting structures 122 are column or pillar shaped having a diameter of about 0.4 mm to about 0.8 mm. However, embodiments are not limited in this regard. Other shapes and sizes are also possible provided the plurality of supporting structures 122 limit buckling of the first casing 110 and second casing 120.

Figure 2C:
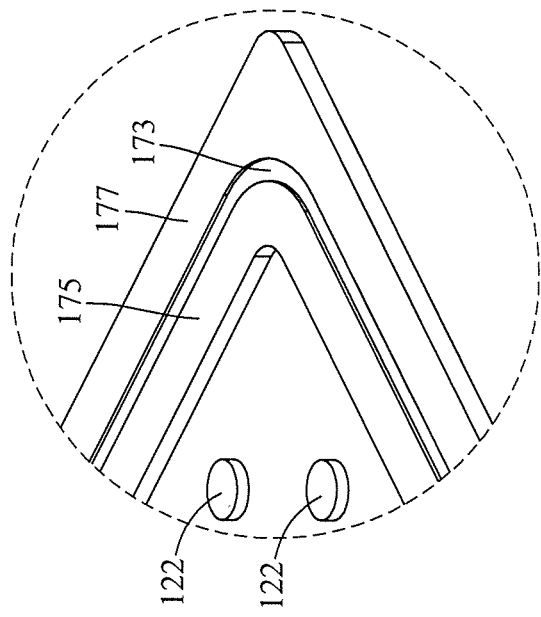
FIG. 2C illustrates the encircled region 2C of FIG. 2A in greater detail.
Figure 2B:
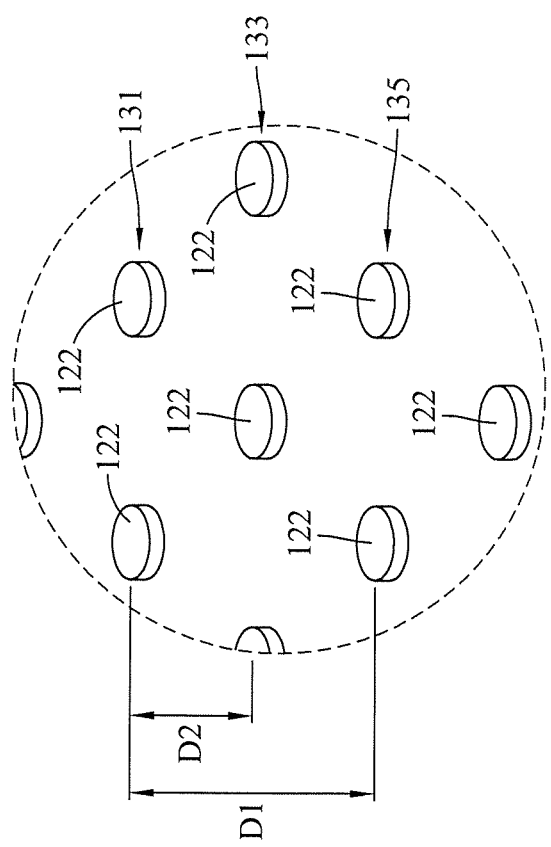
FIG. 2B illustrates the encircled region 2B of FIG. 2A in greater detail.

FIG. 2B illustrates the encircled region 2B of FIG. 2A in greater detail. In some embodiments, and as illustrated, the supporting structures 122 are arranged in rows (or columns) with immediately adjacent rows offset (or staggered) from each other. For example, as illustrated in FIG. 2B, the supporting structures 122 in row 131 are offset from the supporting structures 122 in row 133. In some embodiments, the distance D1 between alternate rows of supporting structures 122 (e.g., rows 131 and 135) is twice the distance between adjacent rows of supporting structures 122 (e.g., rows 131 and rows 133). In some embodiments, the distance D1 is between 3.5 mm to 4.5 mm and the distance D2 is between 1.5 mm to 2.5 mm. However, embodiments are not limited in this regard, and the distances D1 and D2 can be varied as required by application and design provided the plurality of supporting structures 122 limit buckling of the first casing 110 and second casing 120.

FIG. 2C illustrates the encircled region 2C of FIG. 2A in greater detail. As illustrated, the inner surface 123 includes a first fixing structure 175 along the outer periphery of the second casing 120 and a second fixing structure 177 surrounding the first fixing structure 175 and along the outer periphery of the second casing 120. In some embodiments, the first fixing structure 175 and the second fixing structure 177 define a channel or groove 173 therebetween. The inner surface of the first casing 110 includes a corresponding protrusion that is received in the groove 173 for securing the first casing 110 and the second casing 120 to each other.

In some embodiments, the thickness of the first casing 110 is smaller than the thickness of the second casing 120. As an example, the thickness of first casing 110 is about 0.1 mm to about 0.15 mm and the thickness of the second casing 120 is about 0.2 mm to about 0.35 mm. An overall thickness of the vapor chamber 100 including the first casing 110 and the second casing 120 is about 0.3 mm to 0.5 about mm. However, embodiments are not limited in this regard, and the thickness of the first casing 110 may be greater than the thickness of the second casing 120.

The inner surface 123 is opposite to the outer surface 125 of the main body 121. The outer surface 125 forms part of the outer surface of the vapor chamber 100 and is substantially planar. The first casing 110 is connected to the main body 121 of the second casing 120 by welding, soldering, brazing, or diffusion bounding. The second casing 120 has a first or "broad" portion A1 and a second or "narrow" portion A2. The first portion A1 has a width W1 and the second portion A2 has a width W2. The width W1 is larger than the width W2. The first portion has length L1 and the second portion has a length L2. The sum of the lengths L1 and L2 is the length L3 of the longest side of the vapor chamber 100. It will thus be understood that each of the first portion A1 and the second portion A2 has a different cross-sectional area. In an embodiment, the width W1 of the first portion A1 is approximately 80 millimeters (mm), the width W2 of the second portion A2 is approximately 18 mm. The length L1 is about 90 mm to about 100 mm, and the length L3 is about 120 mm to about 130 mm. However, embodiments are not limited in this regard and can be varied depending on the application and design requirements. In other embodiments, the width W2 of the second portion A2 may be equal to or less than half of the width W1 of the first portion A1. In still other embodiments, the width W2 of the second portion A2 may be equal to or less than one-third of the width W1 of the first portion A1.

The first wick structure 130 is in a form of a sheet and is disposed between the first casing 110 and the second casing 120. The first wick structure 130 includes, for example, copper mesh. The first wick structure 130 contacts the first casing 110 and the second wick structure 140. The first wick structure 130 provides a flow path for the cooling fluid circulating in the vapor chamber 100.

The second wick structure 140 may be or include a bundle of copper wires twisted to form a single helical structure. The second wick structure 140 is located in the gaps between the supporting structures 122 and contacts the inner surface 123 of the second casing 120, and thereby is in contact with the second casing 120. Although the second wick structure 140 has been disclosed as a bundle of wires twisted into a helical structure, embodiments are not limited thereto. In other embodiments, the second wick structure 140 may be or include a copper sintered powder wick structure including copper wires interlaced or twisted into a bundle. In some other embodiments, the second wick structure 140 may be or include a plurality of the bundles of wires being interlaced or twisted. In still other embodiments, the second wick structure 140 includes a screen mesh wick structure or groove wick structure.

In an embodiment and as illustrated, the second wick structure 140 is a longitudinally extending structure and is relatively straight (without any curves or bends) and is disposed proximate upper ends of the first portion A1 and second portion A2. One end S of the second wick structure 140 is located in the second portion A2 and proximate (but not contacting) a lateral edge A21 of the second portion A2. The lateral edge A21 is an outer edge of the second portion A2, and thereby of the second casing 120. In some embodiments, the end S of the second wick structure 140 may not contact with the edge A21 of the second portion A2, and may be spaced apart from the edge A21 of the second portion A2. The other longitudinally opposite end E of the second wick structure 140 is located in the first portion A1. A heat source H is attached to the outer surface of the first casing 110 and thereby the outer surface of the vapor chamber 100 using a thermal paste, or other known techniques. FIG. 2 illustrates a vertical projection (dashed box) of the heat source H on the second casing 120. The heat source H is illustrated as square shaped for the sake of illustration. It will be understood that the shape of the heat source H is not limited to a square shape and the heat source H can have any desired shaped. The end E of the second wick structure 140 is spaced (e.g., vertically, in FIG. 2) from the heat source H by a distance D. The distance D is approximately 18.5 mm, but embodiments are not limited thereto. In some embodiments, the end E of the second wick structure 140 may overlap the heat source H or the end E and boundary (edges) of the heat source H may be coincident. It will be understood that the distance D between the end E of the second wick structure 140 and the heat source H is not limited to any particular value and may be adjusted according to the size or shape of the vapor chamber and as per user and design requirements.

The vapor chamber 100 includes a working appendage 1150 that is cooperatively formed by a protrusion 1152 of the second casing 120 and a corresponding protrusion of the first casing 110. The working appendage 1150 includes a charging channel 1158 formed by the first casing 110 and the second casing 120. The charging channel 1158 fluidly communicates with the interior cavity of the vapor chamber 100 formed by the inner surface 123 of the second casing 120 and the inner surface of the first casing 110. The working appendage 1150 is used to fill the interior cavity of the vapor chamber 100 with working fluid and vacuuming out the air from the interior cavity. In some embodiments, the working appendage 1150 is centrally located along the width W1. However, in other embodiments, the working appendage 1150 is located offset from the central location or located on other sides or surfaces of the vapor chamber 100.

Figure 2D:
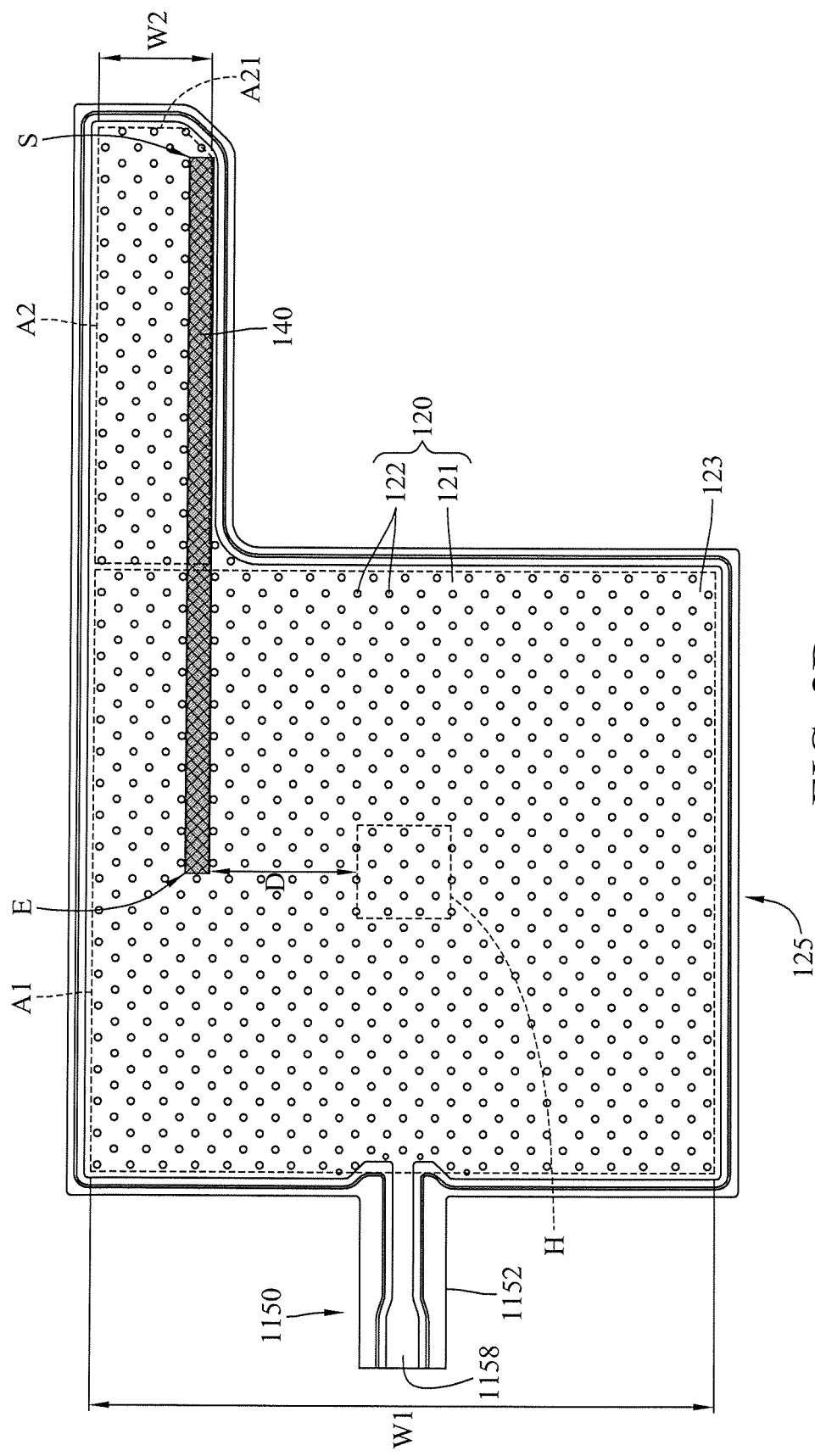
FIG. 2D is a plan view of the second casing, according to embodiments of the disclosure.

FIG. 2D is a plan view of the second casing 120, according to embodiments of the disclosure. In contrast to FIG. 2A, as illustrated, the second wick structure 140 is located proximate a lower end of the second portion A2. The distance D between the end E of the second wick structure 140 and the heat source H is thus reduced. The second wick structure 140 is spaced from the lateral edge A21 of the second portion A2.

Figure 3:
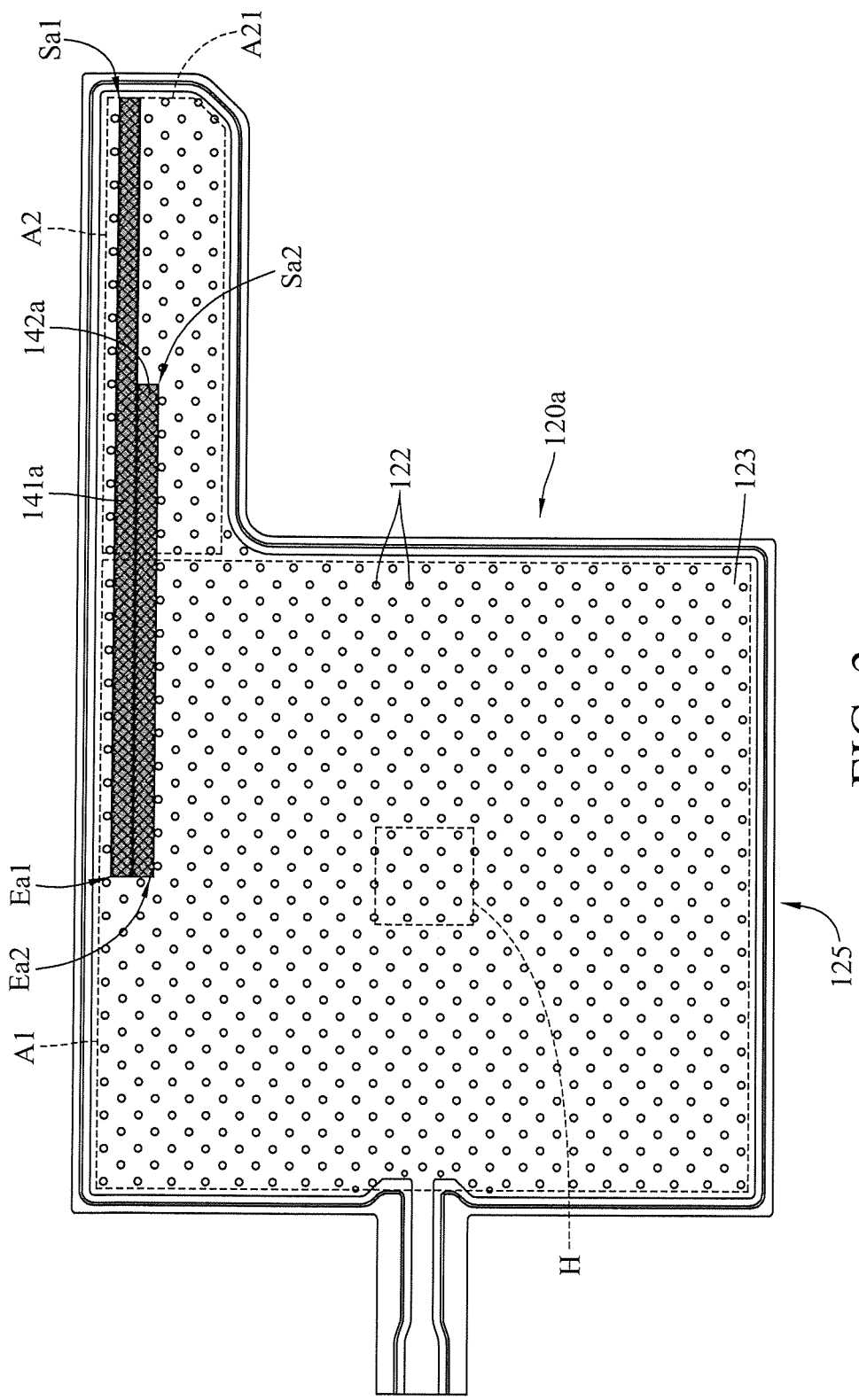
FIG. 3 illustrates a plan view of a second casing including two wick structures, according to embodiments of the disclosure.

In some embodiments, the vapor chamber 100 may include more than one second wick structure 140. FIG. 3 illustrates a plan view of a second casing 120a including two wick structures 141a and 142a, according to embodiments of the disclosure. The second casing 120a may be used instead of the second casing 120 in FIGS. 1 and 2 in the vapor chamber 100. The second casing 120a may be similar in some respects to the second casing 120 in FIG. 2, and therefore may be best understood with reference thereto where like numerals designate like components not described again in detail.

As illustrated, each of the wick structures 141a and 142a are longitudinally extending structures and are straight structures (without bends or curves) and are disposed on the second casing 120a. The wick structures 141a and 142a are located in the gaps between the supporting structures 122 and each contacts the inner surface 123 of the second casing 120a. In an embodiment, the wick structures 141a and 142a have different lengths. For example, and as illustrated, the wick structure 141a is longer than the wick structure 142a. The wick structures 141a and 142a contact each other along the longitudinal edges thereof and are arranged side by side. One end Sa1 of the wick structure 141a is located in the second portion A2 and is in contact with the edge A21 of the second portion A2. The longitudinally opposite end Ea1 of the wick structure 141a is located in the first portion A1 and spaced (e.g., vertically, in FIG. 3) from the heat source H. One end Sa2 of the wick structure 142a is located in the second portion A2, and the longitudinally opposite end Ea2 of the wick structure 142a is located in the first portion A1 and spaced (e.g., vertically, in FIG. 3) from the heat source H. As illustrated, the ends Ea1 and Ea2 are coincident with each other (e.g., located at a same distance from the edge A21). However, in other embodiments, the ends Ea1 and Ea2 are non-coincident (e.g., located at different distances from edge A21) in the first portion A1.

Compared to the embodiment in FIG. 2, the second casing 120a in FIG. 3 includes the additional wick structure 142a extending from the second portion A2 toward the heat source H. The wick structure 142a improves circulation of cooling fluid in the vapor chamber 100, for example, against gravity. Thus, the efficiency of the vapor chamber 100 in dissipating heat is improved.

Figure 4:
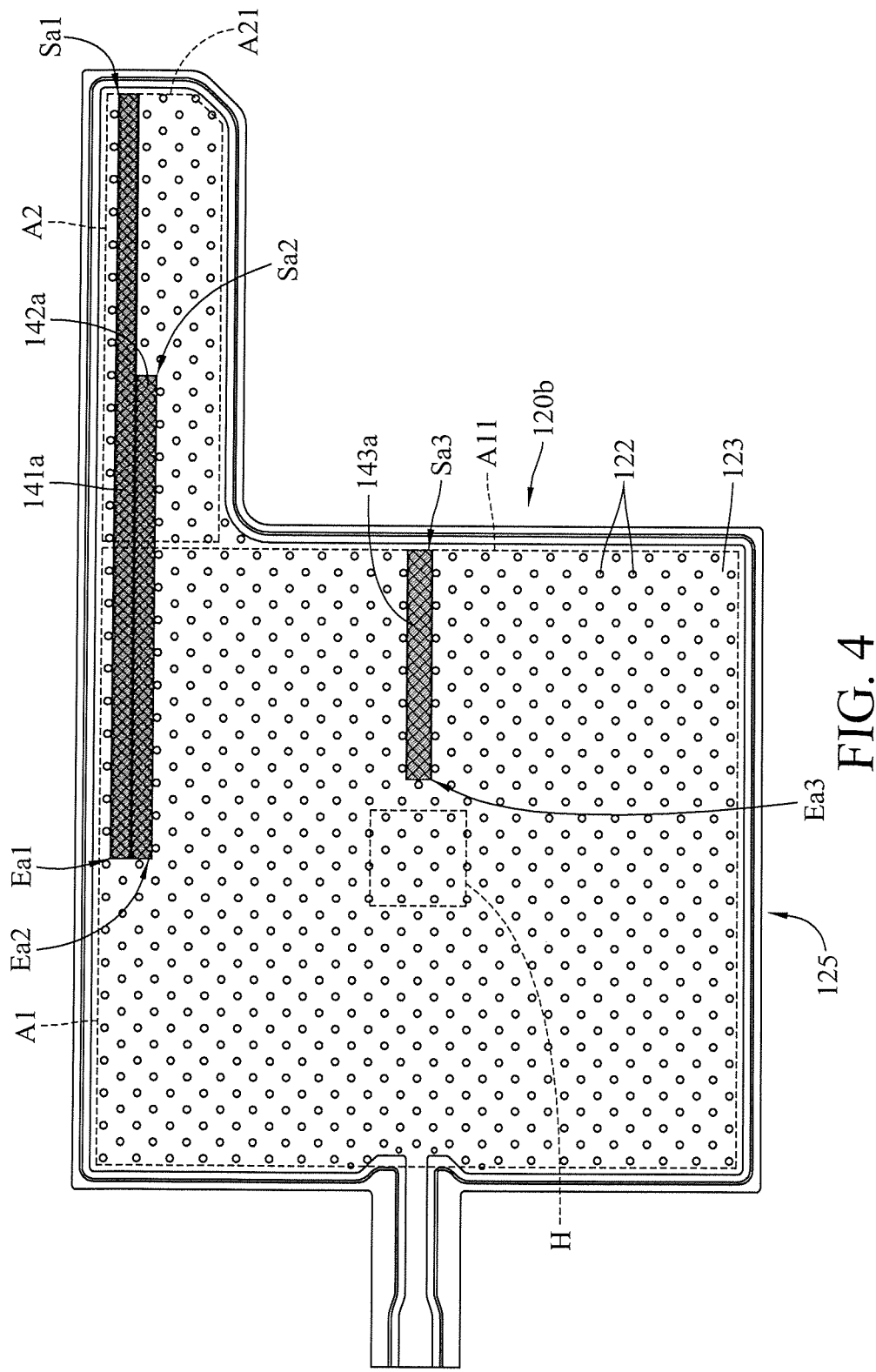
FIG. 4 illustrates a plan view of a second casing including three wick structures, according to embodiments of the disclosure.

FIG. 4 illustrates a plan view of a second casing 120b including three wick structures 141a, 142a, and 143a, according to embodiments of the disclosure. The second casing 120b may be used instead of the second casing 120 in FIGS. 1 and 2 in the vapor chamber 100. The second casing 120b may be similar in some respects to the second casings 120 and 120a in FIGS. 2 and 3, and therefore may be best understood with reference thereto where like numerals designate like components not described again in detail.

Referring to FIG. 4, each of the wick structures 141a, 142a, and 143a are longitudinally extending structures and are straight structures (without bends or curves), and are disposed on the second casing 120b. The wick structures 141a, 142a, and 143a are located in the gaps between the supporting structures 122 and each contacts the inner surface 123 of the second casing 120b. In an embodiment, the wick structures 141a, 142a, and 143a have different lengths. For example, and as illustrated, the wick structure 141a is longer than the wick structures 142a and 143a. The wick structures 141a and 142a contact each other along the longitudinal edges thereof and arranged side by side. The wick structure 143a is spaced (e.g., vertically, in FIG. 4) from the wick structures 141a and 142a. One end Sa1 of the wick structure 141a is located in the second portion A2 and contacts the edge A21 of the second portion A2. The longitudinally opposite end Ea1 of the wick structure 141a is located in the first portion A1 and spaced from the heat source H (illustrated in phantom). One end Sa2 of the wick structure 142a is located in the second portion A2, and the longitudinally opposite end Ea2 of the wick structure 142a is located in the first portion A1 and spaced from the heat source H. As illustrated, the ends Ea1 and Ea2 are coincident with each other (e.g., located at a same distance from the edge A21). However, in other embodiments, the ends Ea1 and Ea2 are non-coincident. One end Ea3 of the wick structure 143a is collinear (e.g., aligned) with the heat source H on the outer surface of first casing 110, and the other end Sa3 of the wick structure 143a is located in the first portion A1 and contacts a vertical edge A11 of the first portion A1. As illustrated, the wick structure 143a is entirely within the first portion A1. The horizontal distance between the end Ea3 of the wick structure 143a and the heat source H is less than the vertical distance between the end Ea2 of the wick structure 142a and the heat source H. Although, the wick structures 141a, 142a, and 143a are indicated as having different lengths, embodiments are not limited thereto. In some embodiments, the wick structures 142a and 143a may have the same lengths. In other embodiments, the end Sa1 of the wick structure 141a and end Sa2 of the wick structure 142a may be located at a same distance from the edge A21.

Compared to embodiment of FIG. 3, the second casing 120b in of FIG. 4 includes an additional wick structure 143a extending from the edge of the first portion A1 toward the heat source H. The wick structure 143a further improves circulation of cooling fluid in the vapor chamber 100, for example, against gravity. Thus, the efficiency of the vapor chamber 100 in dissipating heat is further improved.

Figure 5A:
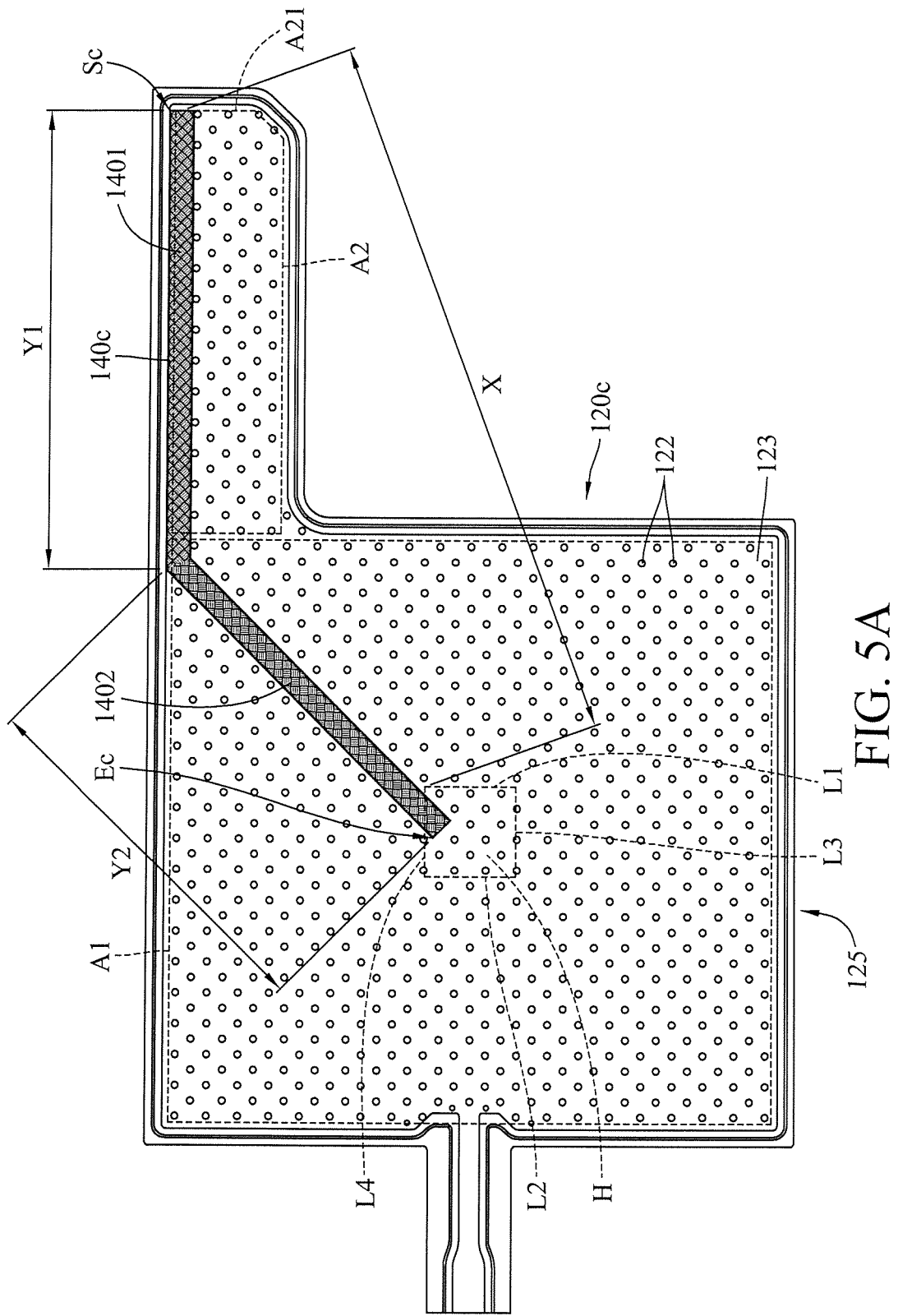
FIG. 5A illustrates a plan view of a second casing and a wick structure, according to embodiments of the disclosure.

FIG. 5A illustrates a plan view of a second casing 120c and a wick structure 140c, according to embodiments of the disclosure. The second casing 120c may be used instead of the second casing 120 in FIGS. 1 and 2 in the vapor chamber 100. The second casing 120c may be similar in some respects to the second casing 120 in FIG. 2, and therefore may be best understood with reference thereto where like numerals designate like components not described again in detail.

As illustrated, the wick structure 140c is disposed in the second casing 120c and has at least one bend. The wick structure 140c is located in the gaps between the supporting structures 122 and contacts the inner surface 123 of the second casing 120. An end Sc of the wick structure 140c is located in the second portion A2 and contacts the edge A21 of the second portion A2 and the opposite end Ec of the wick structure 140c is located in the first portion A1 and overlaps at least part of the heat source H (illustrated in phantom) attached to the outer surface of the first casing 110. In an example, and as illustrated, the wick structure 140c at least partially overlaps one side or end of the heat source H that is closer to the wick structure 140c. For the sake of explanation, it is assumed that the heat source H has a generally rectangular shape including a first side L1 and a second side L2 opposite the first side L1, and a third side L3 and a fourth side L4 opposite the third side L3. The first side L1 is closer to the edge A21. The fourth side L4 is closer to the wick structure 140c. The wick structure 140c overlaps the fourth side L4 of the heat source H.

As illustrated, the wick structure 140c includes two sections 1401 and 1402, having lengths Y1 and Y2, respectively. The sections 1401 and 1402 are connected to each other at an angle (greater than 0° and less than 180°). The overall length of the wick structure 140c is the sum of the lengths Y1 and Y2. In an example, the overall length is approximately 118 mm, but the disclosure is not limited thereto. In other embodiments, the overall length of the wick structure 140c increased or decreased as long as the wick structure 140c is accommodated within the vapor chamber 100. In an embodiment, an extent of the wick structure 140c may be equal to the minimum distance X between the end Sc of the wick structure 140c and the heat source H. More specifically, the minimum distance X is measured from the end Sc to a point on the heat source H nearest to the end Sc as projected vertically on the inner surface 123. For instance, the distance X is approximately 105 mm. The heat dissipation efficiency of the vapor chamber including the wick structure 140c is relatively higher when the overall length of the wick structure 140c is equal to or less than about 126 mm.

The wick structure 140c decreases a distance the cooling fluid has to circulate in the vapor chamber 100. The length of the wick structure 140c is not limited to any particular length and may be adjusted according to user and design requirements.

Figure 5B:
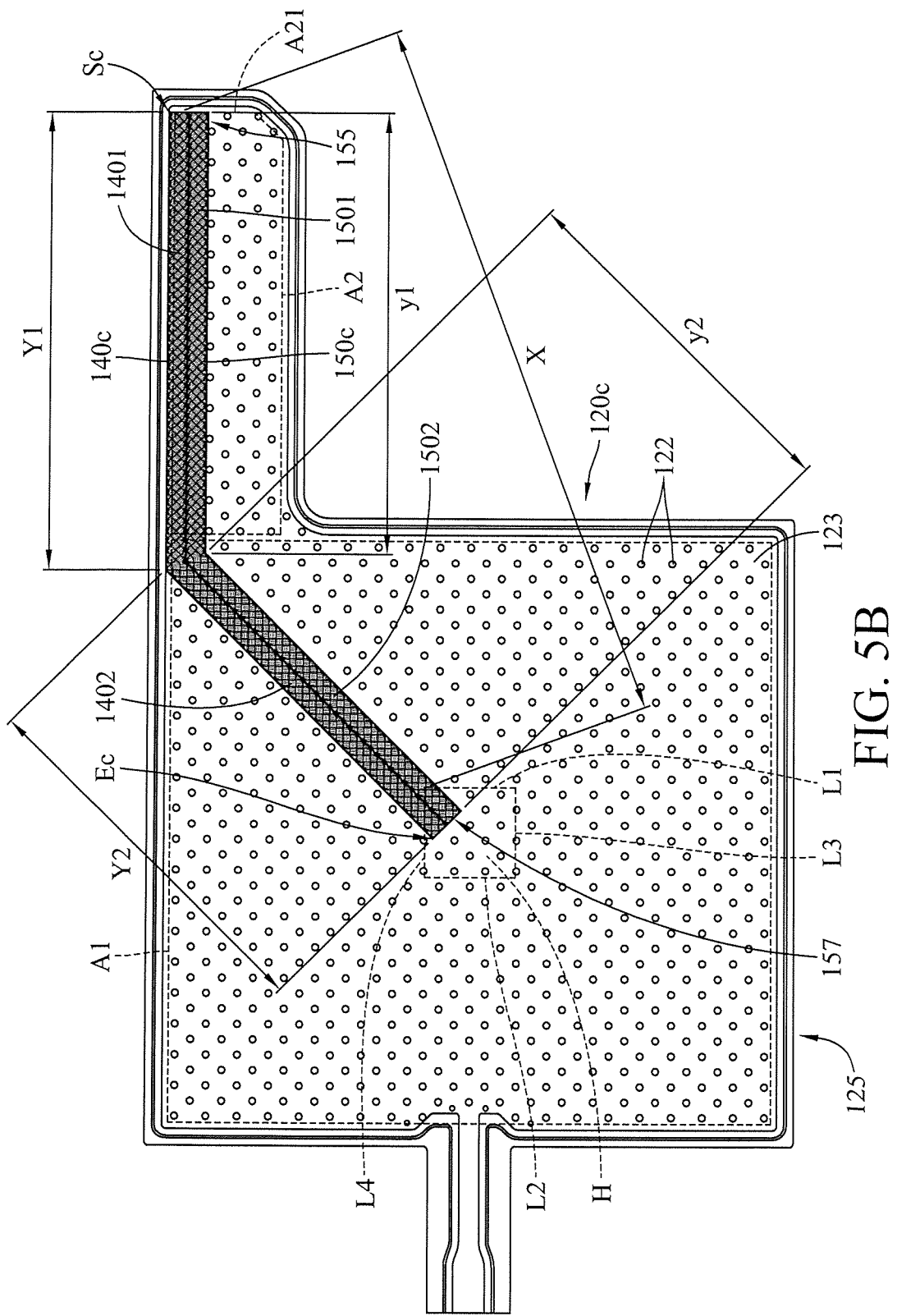
FIG. 5B illustrates a plan view of the second casing of FIG. 5A including two wick structures, according to embodiments of the disclosure.

FIG. 5B illustrates a plan view of the second casing 120c including the wick structure 140c and a wick structure 150c, according to embodiments of the disclosure. The wick structure 150c is shaped and sized (or otherwise configured) similar to the wick structure 140c. The wick structure 150c contacts the wick structure 140c at a bottom side thereof. As illustrated, the wick structure 150c is located in the gaps between the supporting structures 122 and contacts the inner surface 123 of the second casing 120c. An end 155 of the wick structure 150c is located in the second portion A2 and contacts the edge A21 of the second portion A2 and the opposite end 157 of the wick structure 150c is located in the first portion A1 and overlaps at least part of the heat source H (illustrated in phantom) attached to the outer surface of the first casing 110. As depicted, the ends 155 and 157 of the wick structure 150c are aligned with the ends Sc and Ec of the wick structure 140c.

In some embodiments, the wick structure 150c overlaps a same side of the heat source H as overlapped by the wick structure 140c. In other embodiments, the wick structure 150c overlaps a different side of the heat source H.

The wick structure 150c includes sections 1501 and 1502 having lengths Y1 and Y2, respectively, are connected to each other at a same angle (greater than 0° and less than 180°) as the sections 1401 and 1402 of the wick structure 140c. However, in other embodiments, the lengths of the sections 1501 and 1502 are different from the lengths of the sections 1401 and 1402. In some embodiments, the length of the section 1501 is smaller than the length of the section 1401. In some other embodiments, the length of the section 1502 is longer than the length of the section 1402.

Figure 6A:
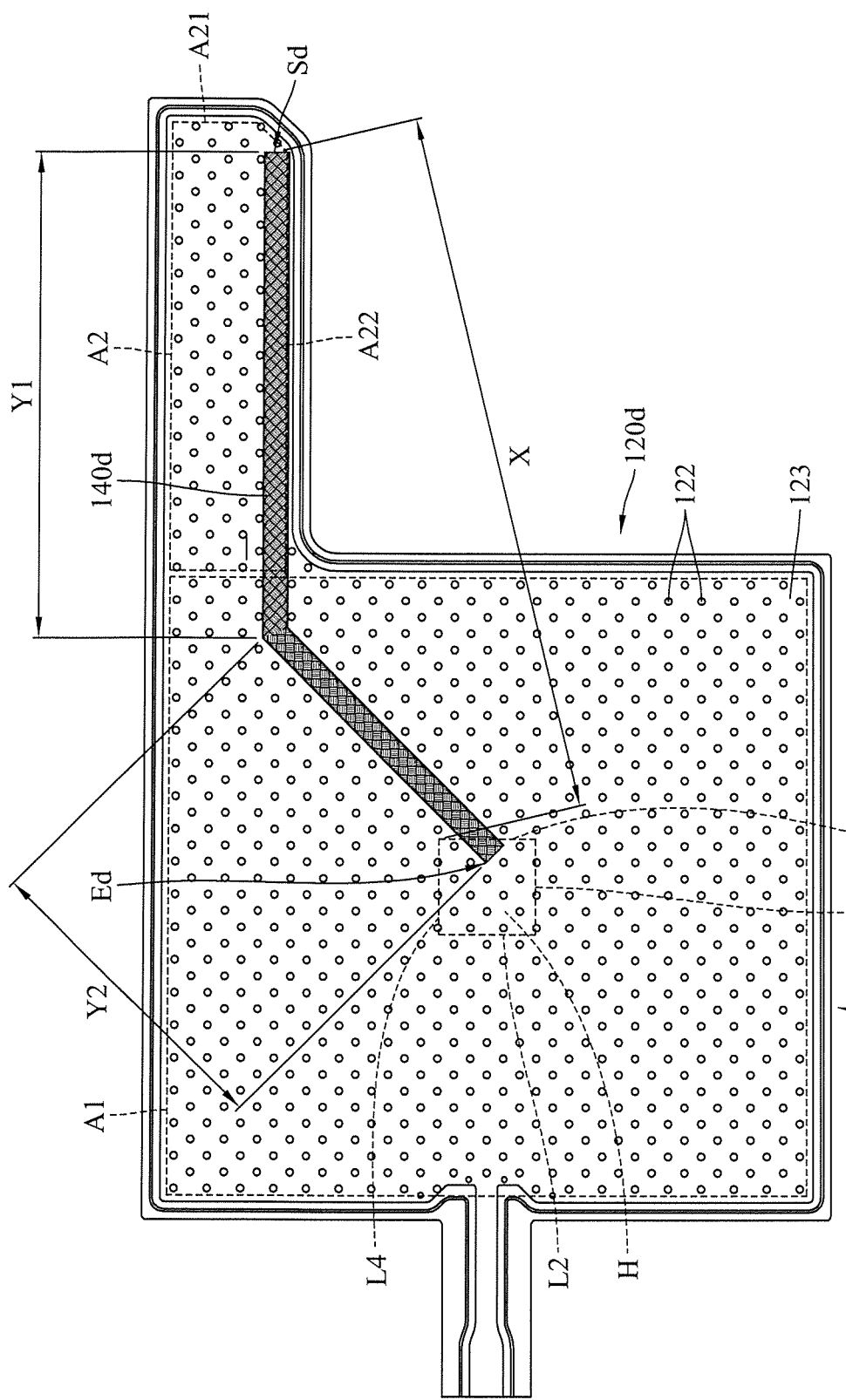
FIG. 6A illustrates a plan view of a second casing and a wick structure, according to embodiments of the disclosure.

The location of the wick structure is not restricted to any particular location in the vapor chamber. FIG. 6A illustrates a plan view of a second casing 120d and a wick structure 140d, according to embodiments. The second casing 120d may be used instead of the second casing 120 of FIGS. 1 and 2 in the vapor chamber 100. The second casing 120d may be similar in some respects to the second casing 120c in FIG. 5A, and therefore may be best understood with reference thereto where like numerals designate like components not described again in detail.

Referring to FIG. 6A, the wick structure 140d has at least one bend and is disposed on the second casing 120d. The wick structure 140d is located in the gaps between the supporting structures 122 and contacts the inner surface 123 of the second casing 120d. One end Sd of the wick structure 140d is located in the second portion A2, and the other opposite end Ed of the wick structure 140d is located in the first portion A1 and overlaps the heat source H attached to the outer surface of the first casing 110. Assuming, for the sake of explanation, that the heat source H is the same as the heat source H in FIG. 5A, the wick structure 140d overlaps the first side L1. As illustrated, the section having length Y1 of the wick structure 140d contacts a lower horizontal edge A22 of the second portion A2.

The wick structure 140d has a relatively shorter length that the wick structure 140c of FIG. 5A. The overall length of the wick structure 140d is approximately 108 mm, but the disclosure is not limited thereto. In other embodiments, the overall length of the wick structure 140d increased or decreased as long as the wick structure 140c is accommodated within the vapor chamber 100. An extent of the wick structure 140d may be equal to the minimum distance X between the end Sd of the wick structure 140d and the heat source H. More specifically, the minimum distance X is measured from the end Sd to a point on the heat source H nearest to the end Sd projected vertically on the inner surface 123. For example, the distance X is approximately 100 mm. The heat dissipation efficiency of the vapor chamber including the wick structure 140c is relatively higher when the overall length of the wick structure 140d is equal to or less than about 120 mm.

Figure 6B:
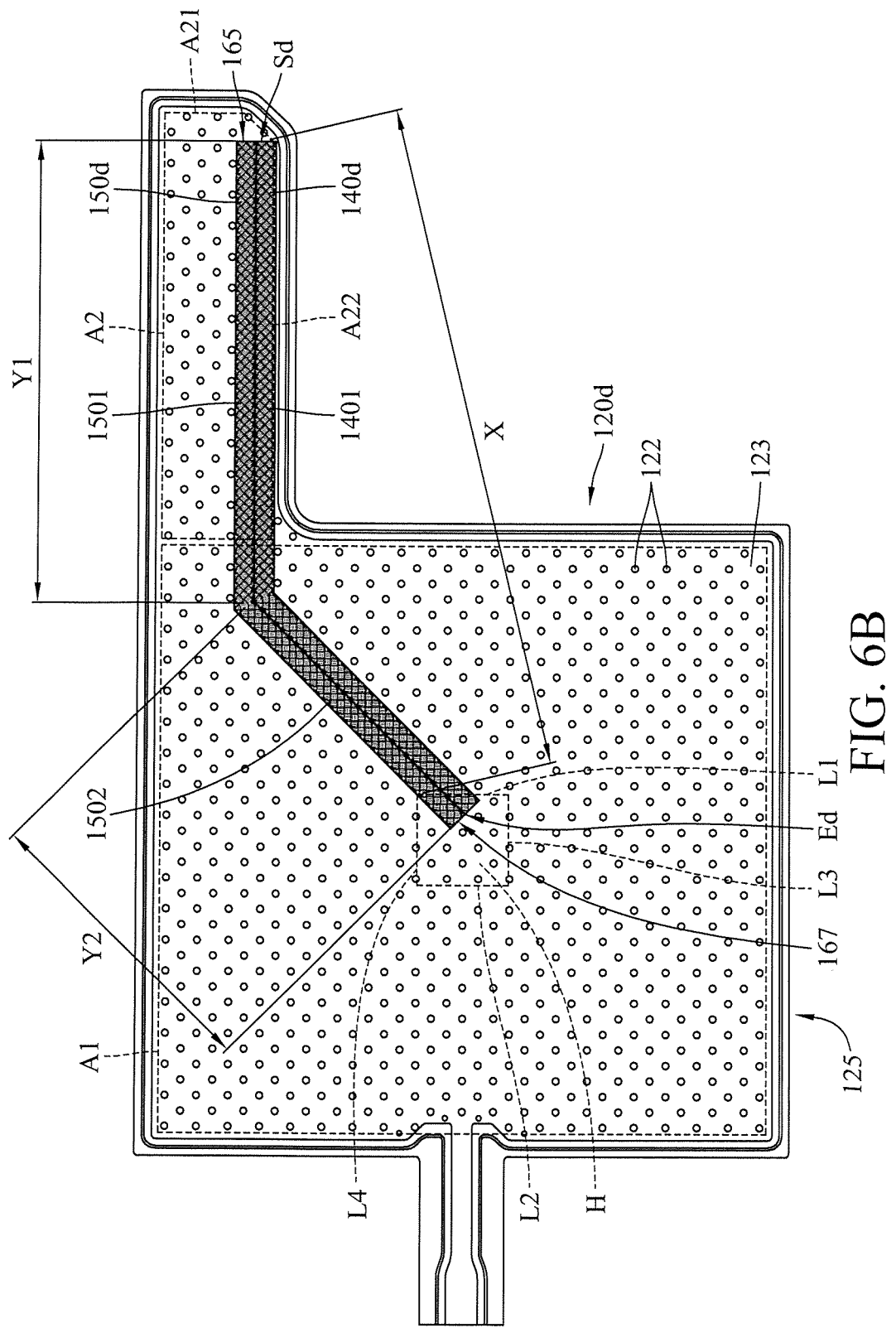
FIG. 6B illustrates the second casing of FIG. 6A including the wick structure of FIG. 6A and an additional wick structure, according to embodiments of the disclosure.

FIG. 6B illustrates the second casing 120d including the wick structure 140d and a wick structure 150d, according to embodiments of the disclosure. The wick structure 150d is shaped and sized (or otherwise configured) similar to the wick structure 140d. The wick structure 150d contacts the wick structure 140d at the top side thereof. The wick structure 150d is located in the gaps between the supporting structures 122 and contacts the inner surface 123 of the second casing 120d.

An end 165 of the wick structure 150d is located in the second portion A2 and is spaced from the edge A21 of the second portion A2 and the opposite end 167 of the wick structure 150d is located in the first portion A1 and overlaps at least part of the heat source H (illustrated in phantom) attached to the outer surface of the first casing 110. As depicted, the ends 165 and 167 of the wick structure 150d are aligned with the ends Sd and Ed of the wick structure 140d.

In some embodiments, the wick structure 150d overlaps a same side of the heat source H as overlapped by the wick structure 140d. In other embodiments, the wick structure 150d overlaps a different side of the heat source H.

The wick structure 150d sections 1501 and 1502 having lengths Y1 and Y2, respectively, are connected to each other at a same angle (greater than 0° and less than 180°) as the sections 1401 and 1402 of the wick structure 140d. However, in other embodiments, the lengths of the sections 1501 and 1502 are different from the lengths of the sections 1401 and 1402. In some embodiments, the length of the section 1501 is smaller than the length of the section 1401. In some other embodiments, the length of the section 1502 is longer than the length of the section 1402.

Referring to FIGS. 5A and 6A, the wick structure 140d in FIG. 6A is shorter than the wick structure 140c in FIG. 5A, and this reduces the path for the cooling liquid to circulate in the vapor chamber 100. The length of the wick structure 140d is not limited to any particular length and may be adjusted according to user and design requirements.

Figure 7A:
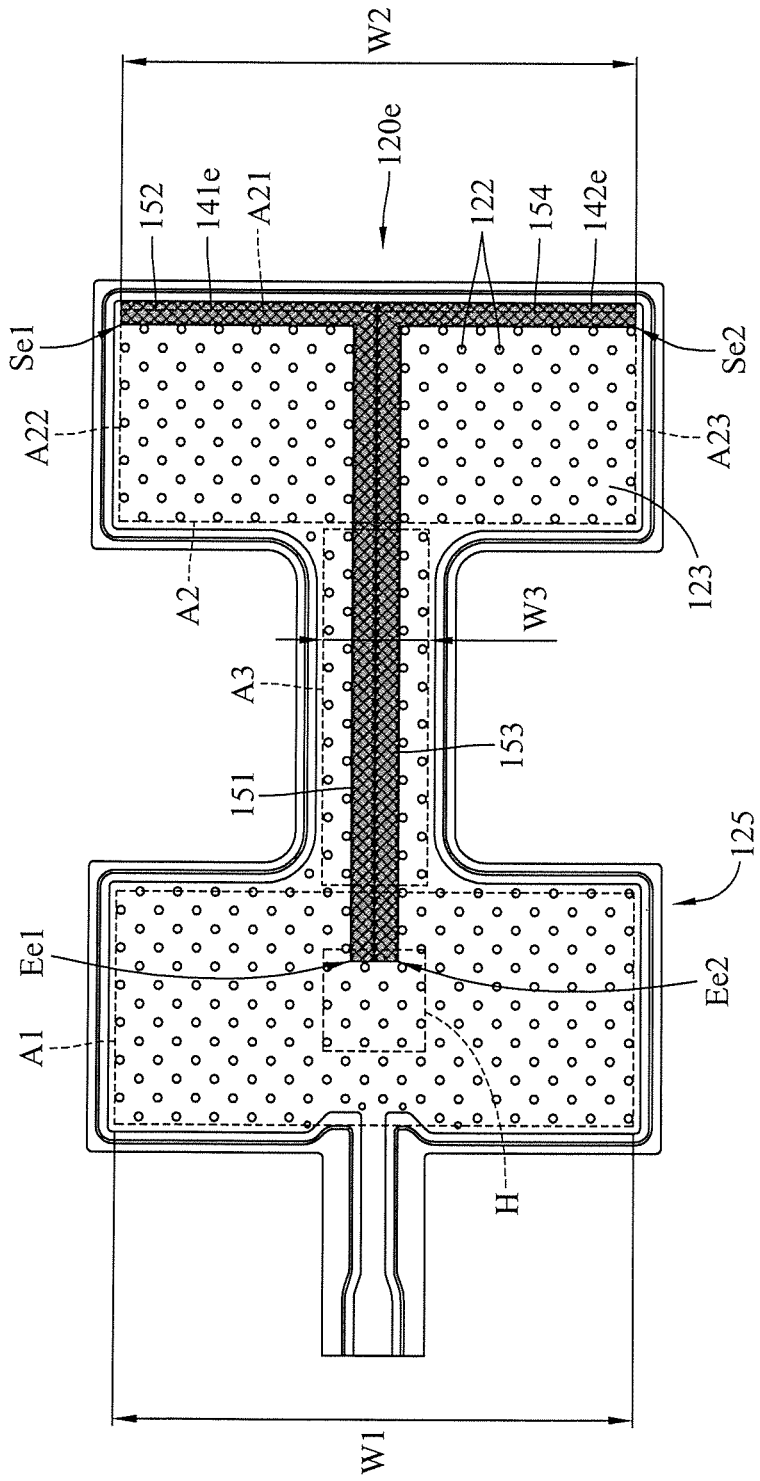
FIG. 7A illustrates a plan view of a second casing including two wick structures, according to embodiments of the disclosure.

According to embodiments, the shapes of the first casing and the second casing are not limited to any particular shape. FIG. 7A illustrates a plan view of a second casing 120e including two wick structures 141e and 142e, according to embodiments of the disclosure. The second casing 120e may be used in a vapor chamber that includes a first casing and a sheet-like wick structure similar to the first casing 110 and the first wick structure 130 in FIG. 1, respectively, but each having a shape corresponding to the shape of the second casing 120e.

As illustrated in FIG. 7A, the second casing 120e is generally H-shaped and has a first portion A1, a second portion A2, and a third portion A3. The third portion A3 is located between the first section A1 and second section A2. The first portion A1 has a width W1, the second portion A2 has a width W2, and the third portion A3 has a width W3. The width W1 is equal to the width W2, and the width W3 is smaller than the width W1. However, in other embodiments the widths W1 and W2 may be different, but each greater than the width W3. The wick structures 141e and 142e are disposed on the second casing 120e. The wick structures 141e and 142e each have a generally L-shape and are located in the gaps between the supporting structures 122 and each contacts the inner surface 123 of the second casing 120e.

The wick structure 141e includes a first section 151 that is disposed in the first portion A1, second portion A2, and third portion A3. The wick structure 141e includes a second section 152 disposed in the second portion A2 and at an angle relative to the first section 151. The first section 151 is connected to the second section 152 in the second portion A2. In an example, the first section 151 is perpendicular to the second section 152. However, embodiments are not limited thereto, and the first section 151 is connected to the second section 152 at angles greater than or less than 90°.

The wick structure 142e includes a first section 153 that is disposed in the first portion A1, second portion A2, and third portion A3. The wick structure 142e includes a second section 154 disposed in the second portion A2 and at an angle relative to the first section 153. The first section 153 is connected to the second section 154 in the second portion A2. In an example, the first section 153 is perpendicular to the second section 154. However, embodiments are not limited thereto, and the first section 153 is connected to the second section 154 at angles greater than or less than 90°. The first section 151 of the wick structure 141e and the first section 153 of the wick structure 141e contact each other.

The first section 151 includes an end Ee1 of the wick structure 141e in the first portion A1. The end Ee1 overlaps the heat source H attached to the outer surface of the first casing 110. The first section 153 includes an end Ee2 of the wick structure 142e in the first portion A1. The end Ee1 overlaps the heat source H attached to the outer surface of the first casing 110.

The second section 152 includes an end Se1 of the wick structure 141e in the second portion A2. The second section 154 includes an end Se2 of the wick structure 142e in the second portion A2.

As illustrated, the end Se1 of the wick structure 141e is located proximate (non-contacting) an upper edge A22 of the second portion A2 and the end Se2 of the wick structure 142e is located proximate a lower edge A23 of the second portion A2 opposite the upper edge A22. The second sections 152 and 154 are disposed proximate the edge A21 of the second portion A2. The edge A21 connects the upper edge A22 and lower edge A23. In other embodiments, the end Se1 may contact the upper edge A22, the end Se2 may contact the lower edge A23, and the second sections 152 and 154 contact the edge A21.

Figure 7B:
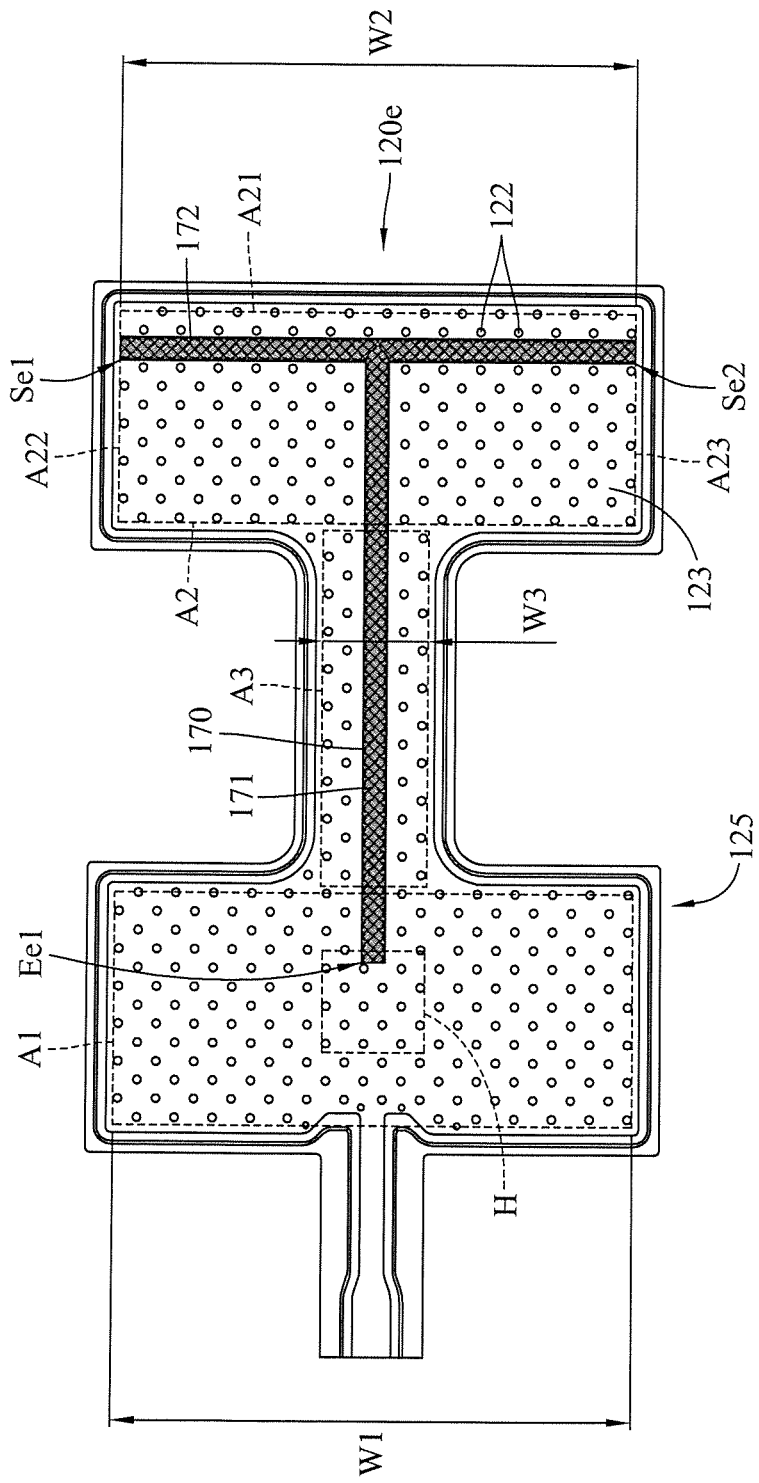
FIG. 7B illustrates a plan view of the second casing of FIG. 7A including a single wick structure, according to embodiments of the disclosure.

Instead of two wick structures 141e and 142e, some embodiments include a single wick structure. FIG. 7B illustrates a plan view of the second casing 120e including a single wick structure 170, according to embodiments of the disclosure. The wick structure 170 includes a first section 171 disposed in the first portion A1, second portion A2, and third portion A3. The wick structure 170 includes a second section 172 disposed in the second portion A2 and at an angle relative to the first section 171. The first section 171 is connected to the second section 172 in the second portion A2. In an example, the first section 171 is perpendicular to the second section 172. However, embodiments are not limited thereto, and the first section 171 is connected to the second section 172 at angles greater than 0° or less than 90°.

The first section 171 includes an end Ee1 of the wick structure 170 in the first portion A1. The end Ee1 overlaps the heat source H attached to the outer surface of the first casing 110. The second section 172 includes an end Se1 of the wick structure 170 in the second portion A2. The second section 172 includes an end Set opposite end Se1 located in the second portion A2. The second section 172 is disposed proximate the edge A21 of the second portion A2.

Figure 8A:
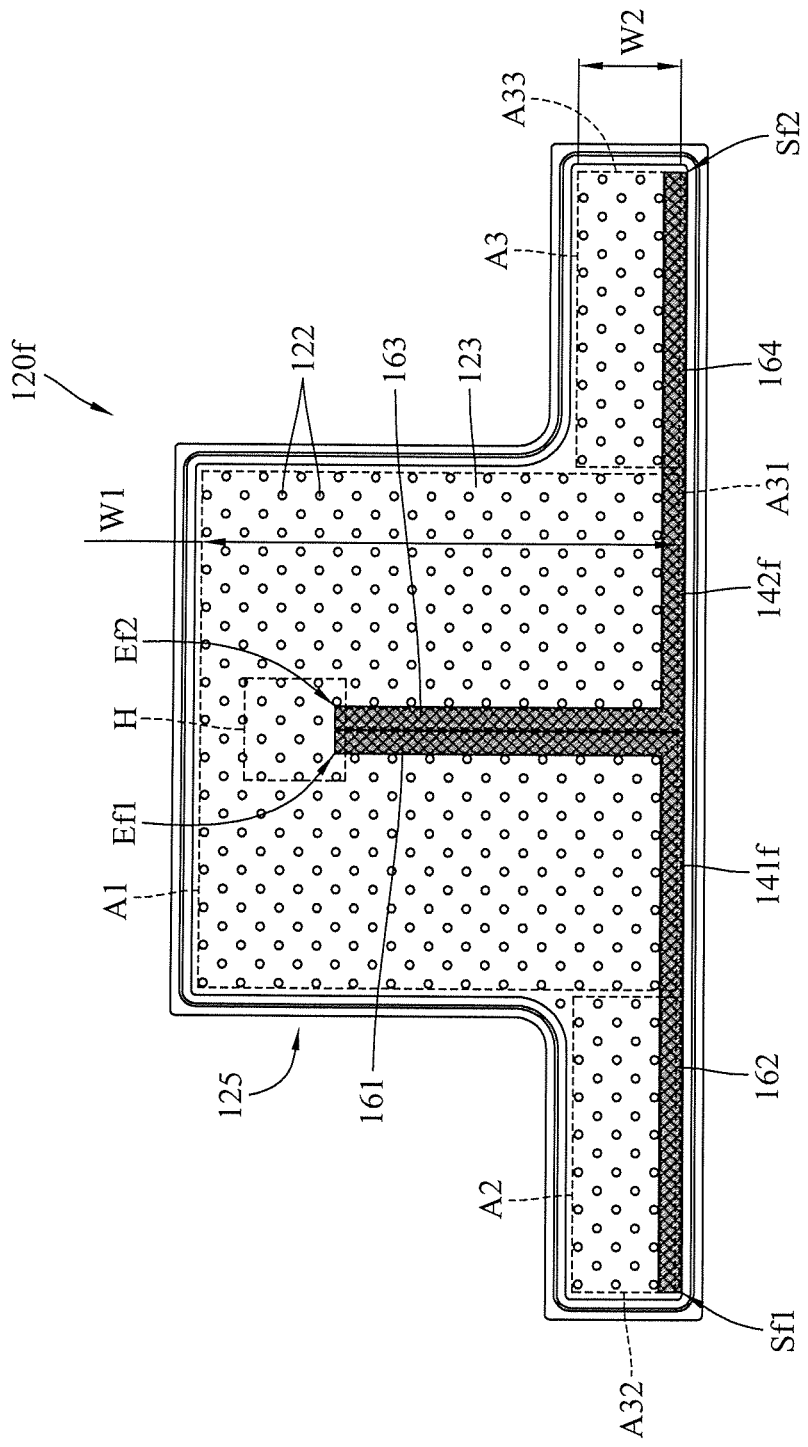
FIG. 8A illustrates a plan view of a second casing including two wick structures, according to embodiments of the disclosure.

FIG. 8A illustrates a plan view of a second casing 120*f* including two wick structures 141*f* and 142*f*, according to embodiments of the disclosure. The second casing 120*f* may be used in a vapor chamber that includes a first casing and a sheet-like wick structure similar to the first casing 110 and the first wick structure 130 in FIG. 1, respectively, but each having a shape corresponding to the shape of the second casing 120*f*.

The second casing 120*f* includes a first portion A1 disposed between a second portion A2 and a third portion A3. The first portion A1 has a width W1, and the second portion A2 and the third portion A3 each have a width W2. The width W1 is larger than the width W2. In other embodiments, the second portion A2 and the third portion A3 may have different widths, but smaller than the width W1. The wick structures 141*f* and 142*f* are disposed on the second casing 120*f*. The wick structures 141*f* and 142*f* each have a generally L-shape and are located in the gaps between the supporting structures 122 and each contacts the inner surface 123 of the second casing 120*f*.

The wick structure 141*f* includes a first section 161 that is disposed in the first portion A1. The wick structure 141*f* includes a second section 162 disposed in the first portion A1 and the second portion A2 and at an angle relative to the first section 161. The first section 161 is connected to the second section 162 in the first portion A1. In an example, the first section 161 is perpendicular to the second section 162. However, embodiments are not limited thereto, and the first section 161 is connected to the second section 162 at angles greater than or less than 90°.

The wick structure 142*f* includes a first section 163 that is disposed in the first portion A1. The wick structure 142*f* includes a second section 164 disposed in the third portion A3 and at an angle relative to the first section 163. The first section 163 is connected to the second section 164 in the first portion A1. In an example, the first section 163 is perpendicular to the second section 164. However, embodiments are not limited thereto, and the first section 163 is connected to the second section 164 at angles greater than or less than 90°. The first section 161 of the wick structure 141*f* and the first section 163 of the wick structure 142*f* contact each other.

The first section 161 includes an end Ef1 of the wick structure 141*f* located in the first portion A1. The end Ef1 overlaps the heat source H attached to the outer surface of the first casing 110. The first section 163 includes an end Ef2 of the wick structure 142*f* in the first portion A1. The end Ef2 overlaps the heat source H attached to the outer surface of the first casing 110.

The second section 162 includes an end Sf1 of the wick structure 141*f* in the second portion A2. The second section 164 includes an end Sf2 of the wick structure 142*f* in the third portion A3.

As illustrated, the end Sf1 of the wick structure 141*f* is located proximate an edge A32 of the second portion A2 and the end Sf2 of the wick structure 142*f* is located proximate an edge A33 of the third portion A3 opposite the edge A32. The second sections 162 and 164 are disposed proximate (but not contacting) an edge A31 of the second casing 120*f* that forms (or otherwise defines) the first portion A1, the second portion A2, and the third portion A3 of the second casing 120*f*. The edge A31 connects the edge A32 and edge A33. In other embodiments, the end Sf1 may contact the edge A32, the end Sf2 may contact the edge A33, and the second sections 162 and 164 contact the edge A31.

When the vapor chamber is used in a vertical manner (e.g., in a position wherein the heat source H is located at a level higher than the second portion A2 and third portion A3), the cooling fluid in the vapor chamber evaporates and turns to vapor while absorbing the heat generated by the heat source H. The cooling fluid (in vapor state) flows toward the second portion A2 and the third portion A3 and turns back to liquid state, and the cooling fluid can flow to the first portion A1 via the wick structures 141*f* and 142*f*. This configuration decreases a temperature difference between the first portion A1 and the second portion A2 and the third portion A3 by around 4 to 15 degrees Celsius. The cooling fluid continuously circulates between the first portion A1 and the second portion A2 and the third portion A3, thereby dissipating the heat generated by the heat source H.

Figure 8B:
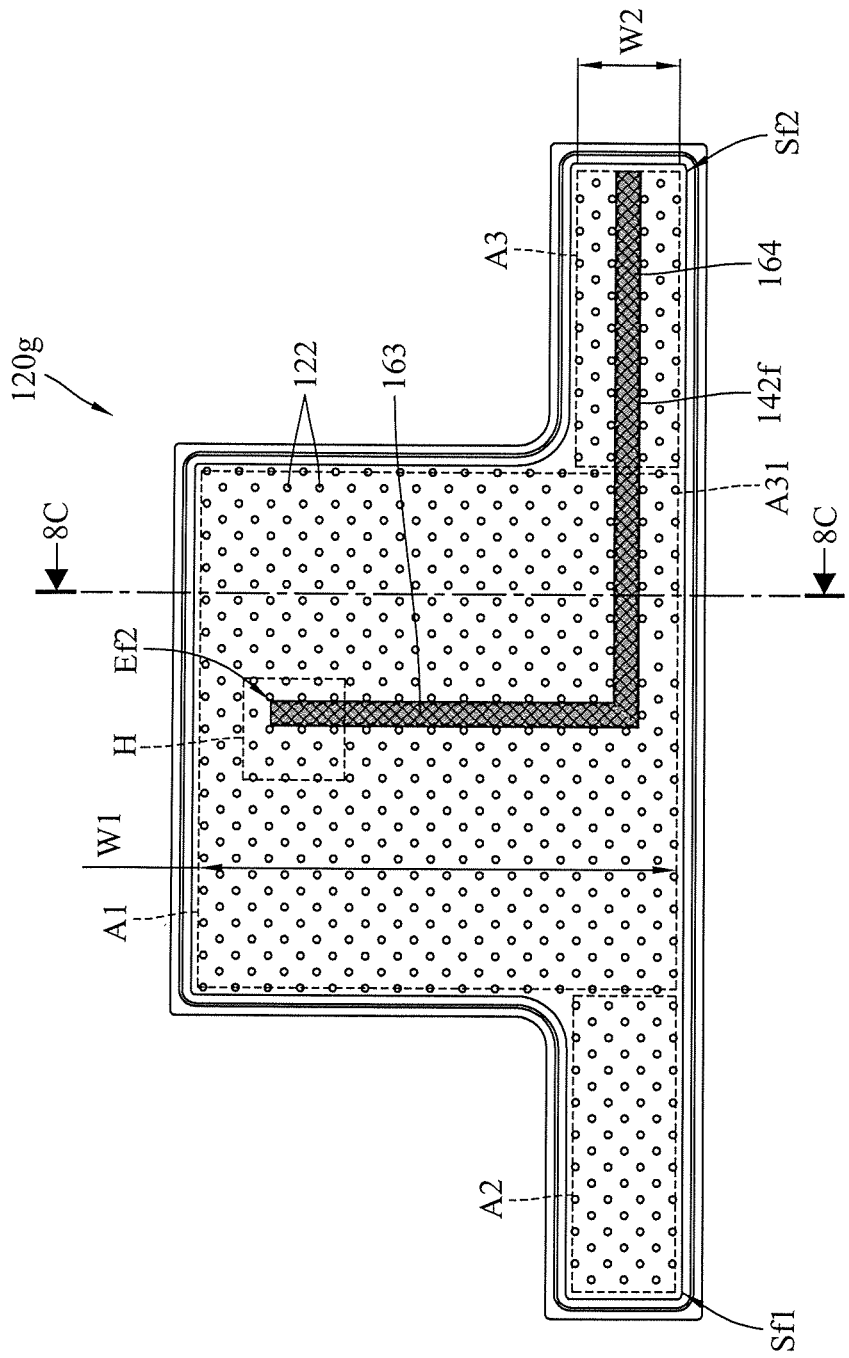
FIG. 8B illustrates a plan view of a second casing including a wick structure, according to embodiments of the disclosure.
Figure 8C:
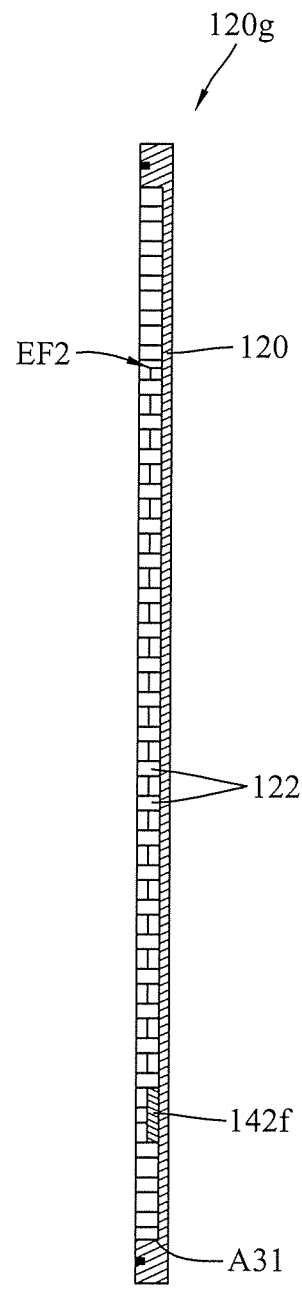
FIG. 8C illustrates a cross-sectional view of the second casing in FIG. 8B, according to embodiments of the disclosure.

FIG. 8B illustrates a plan view of a second casing 120*g* including a wick structure 142*f*, according to embodiments. FIG. 8C illustrates a cross-sectional view of the second casing 120*g* taken along line 8B-8B in FIG. 8B. The second casing 120*g* may be similar in some respects to the second casing 120*f* in FIG. 8A, and therefore may be best understood with reference thereto where like numerals designate like components not described again in detail.

As illustrated in FIG. 8B, the second casing 120*g* includes a single wick structure 142*f*. The wick structure 141*f* is absent. The wick structure 142*f* is spaced from the edge A31. In some embodiments, the second section 164 is disposed mid-way in the third portion A3. In some embodiments, and as illustrated, the first section 163 of the wick structure 142*f* is centrally located in the first portion A1. However, embodiments are not limited in this regard and in some other embodiments, the first section 163 is located offset from the center of the first portion A1.

In some embodiments, the second casing 120*g* includes the wick structure 141*f* (FIG. 8A) and the wick structure 142*f* is absent. The wick structure 141*f* is spaced from the edge A31. In some embodiments, the second section 162 of the wick structure 141*f* is disposed mid-way with respect to the width direction W2 in the second portion A2. In some embodiments, the first section 161 (FIG. 8A) of the wick structure 141*f* is centrally located in the first portion A1. However, in some other embodiments, the first section 161 is located offset from the center of the first portion A1.

Figure 8D:
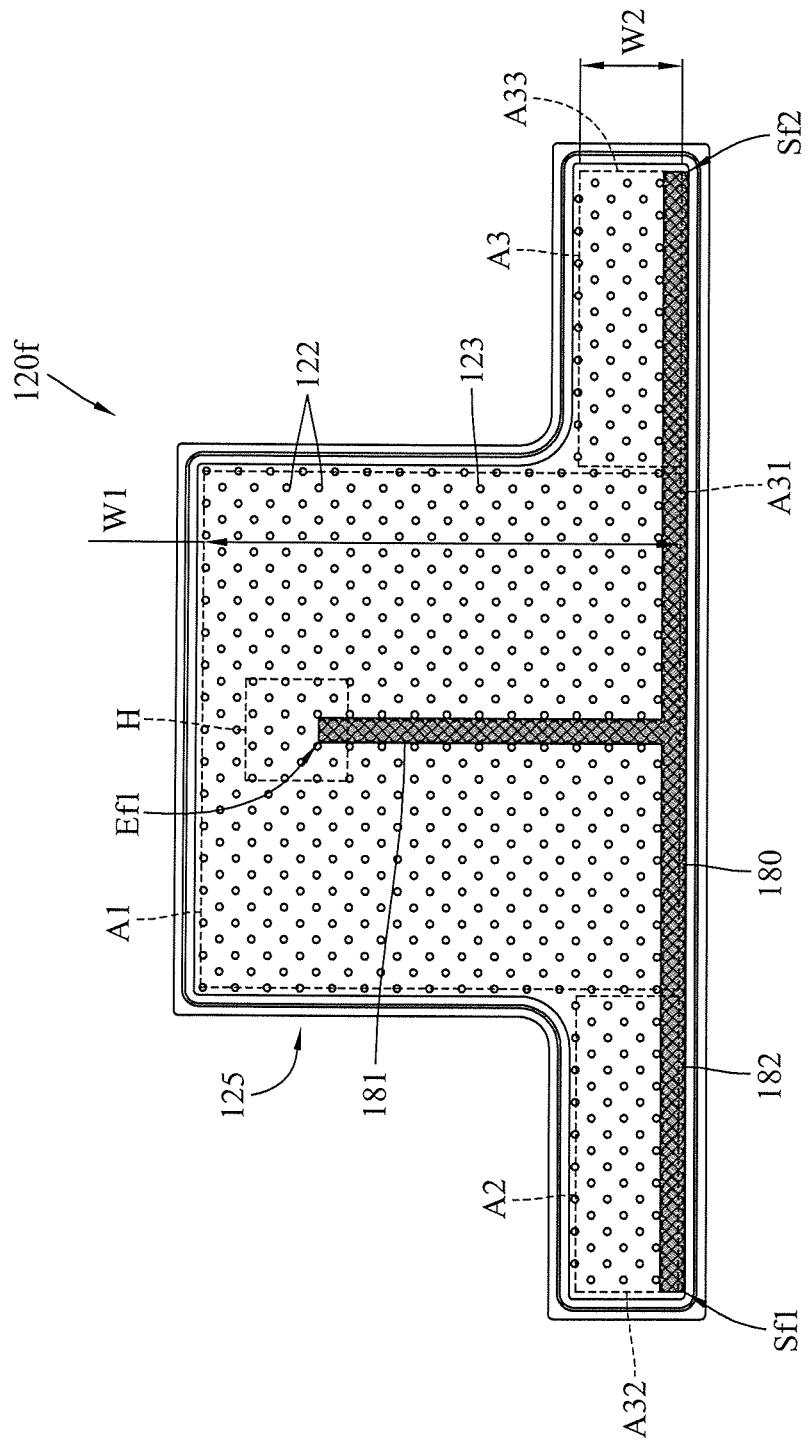
FIG. 8D illustrates a plan view of the second casing including a single wick structure 180, according to embodiments of the disclosure.

Instead of two wick structures 141*f* and 142*f*, some embodiments include a single wick structure. FIG. 8D illustrates a plan view of the second casing 120*f* including a single wick structure 180, according to embodiments of the disclosure. The wick structure 180 includes a first section 181 disposed in the first portion A1. The wick structure 180 includes a second section 182 disposed in the first portion A1, second portion A2, and third portion A3 and at an angle relative to the first section 181. The first section 181 is connected to the second section 182 in the first portion A1. In an example, the first section 181 is perpendicular to the second section 182. However, embodiments are not limited thereto, and the first section 181 is connected to the second section 182 at angles greater than 0° or less than 90°.

The first section 181 includes an end Ef1 of the wick structure 180 in the first portion A1. The end Ef1 overlaps the heat source H attached to the outer surface of the first casing 110. The second section 182 includes an end Sf1 of the wick structure 180 in the second portion A2 and an end Sf2 opposite end Sf1 located in the third portion A3. The second section 182 is disposed proximate (but not contacting) the edge A31 that forms (or otherwise defines) the first portion A1, the second portion A2, and the third portion A3 of the second casing 120f. Although not illustrated, a working appendage similar to the working appendage 1150 in FIG. 2A is included in the second casing 120f in FIGS. 8A, 8B, and 8D. The working appendage is located at any desirable location along the sides of the second casing 120f.

Figure 9:
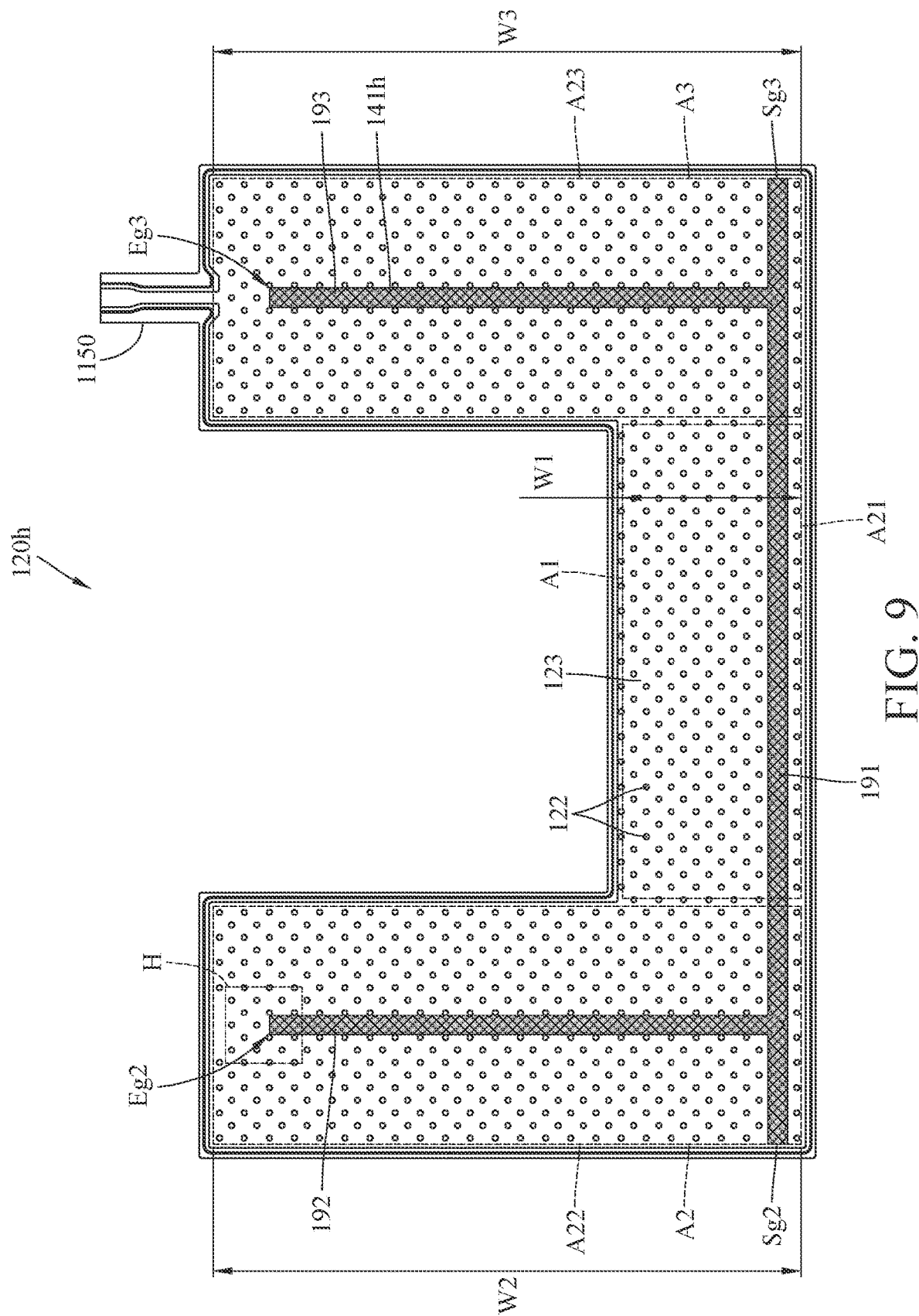
FIG. 9 illustrates a plan view of a second casing including a wick structure, according to embodiments of the disclosure.

FIG. 9 illustrates a plan view of a second casing 120h including a wick structure 141h, according to embodiments of the disclosure. The second casing 120h may be used in a vapor chamber that includes a first casing and a sheet-like wick structure similar to the first casing 110 and the first wick structure 130 in FIG. 1, respectively, but each having a shape corresponding to the shape of the second casing 120h.

As illustrated in FIG. 9, the second casing 120h is generally U-shaped and has a horizontally orientated first portion A1, and a second portion A2 and a third portion A3, each vertically oriented. The first portion A1 is located between the second and third sections A2 and A3. The first portion A1 has a width W1, the second portion A2 has a width W2, and the third portion A3 has a width W3. The width W2 is equal to the width W3, and the width W1 is less than the widths W2 and W3. However, in other embodiments the widths W2 and W3 may be different, but each greater than the width W1. The wick structure 141h is disposed in the second casing 120h and in the gaps between the supporting structures 122. The wick structure 141h contacts the inner surface 123 of the second casing 120h.

The wick structure 141h includes a first section 191 horizontally oriented and disposed in the first portion A1, second portion A2, and third portion A3. The wick structure 141h includes two vertically oriented sections, a second section 192 disposed in the second portion A3 and a third section 193 disposed in the third portion A3. The second section 192 and the third section 193 are transverse to the first section 191. In an embodiment, the second section 192 and the third section 193 are perpendicular to the first section 191. However, embodiments are not limited in this regard and the second section 192 and the third section 193 can be disposed at angles greater than 0° and less than 180° with reference to the first section 191. Each of the first section 191, second section 192, and third section 193 are straight, longitudinal structures without any bends. The second section 192 and the third section 193 are angled relative to the first section 191. The second section 192 and the third section 193 are connected to the first section 191 in the second portion A2 and the third portion A3, respectively. In an embodiment, and as illustrated, the second section 192 and the third section 193 are perpendicular to the first section 191. However, embodiments are not limited in this regard, and the second section 192 and the third section 193 are connected to the first section 191 at angles greater than 0° or less than 90°.

The first section 191 includes an end Sg2 in the second portion A2, and proximate an outer vertical edge A22 of the second portion A2. The first section 191 includes an end Sg3 in the third portion A3 longitudinally opposite the end Sg2, and proximate an outer vertical edge A23 of the third portion A3. The first section 191 is located proximate a bottom edge A21 of the first portion A1, second portion A2, and third portion A3.

The second section 192 includes an end Eg2 in the second portion A2. The end Eg2 is longitudinally opposite the end of the second section 192 connected to the first section 191. Similarly, the third section 193 includes an end Eg3 in the third portion A3. The end Eg3 is longitudinally opposite the end of the third section 193 connected to the first section 191.

As illustrated, the end Eg2 overlaps the heat source H attached to the outer surface of the first casing 110 and over the second portion A2. However, in other embodiments, the end Eg3 overlaps the heat source H attached to the outer surface of the first casing 110 and over the third portion A3. A working appendage 1150 is located in the third portion A3. However in other embodiments, the working appendage 1150 is located in the first portion A1 or the second portion A2 along any desired edge.

Figure 10E:
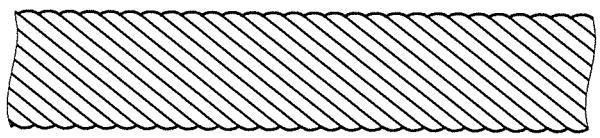
FIGS. 10B-10F illustrate different configurations of the wick structures of FIG. 10A.
Figure 10D:
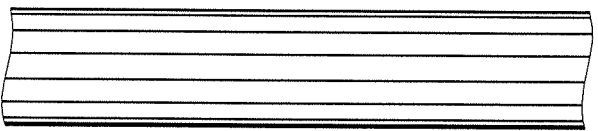
Figure 10C:
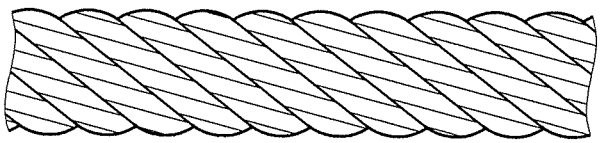
Figure 10B:
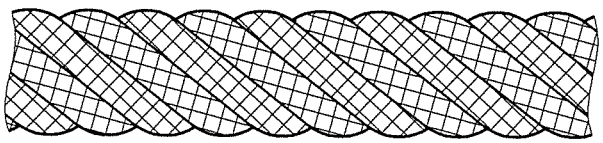
Figure 10A:
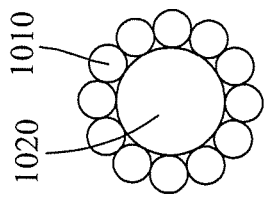
FIG. 10A is a cross-sectional view of a wick structure including multiple wick fibers arranged around a central wick fiber, according to embodiments of the disclosure.

FIG. 10A is a cross-sectional view of a wick structure including multiple wick fibers 1010 arranged around a central wick fiber 1020. In an embodiment, the wick fibers 1010 and 1020 include copper. However, the wick fibers 1010 and/or 1020 can include other materials that facilitate the flow of condensed fluid by capillary force through the wick structure formed using the wick fibers 1010 and 1020.

FIGS. 10B-10F illustrate wick structures 140g, 140h, 140i, 140j, and 140k including different arrangements of the wick fibers 1010 around the central wick fiber 1020. In FIG. 10B, the wick structure 140g includes the wick fibers 1010 twisted together in the shape of a helix to form a (e.g., a structure similar to a braided rope). In FIG. 10C, the wick structure 140h includes the wick fibers 1010 individually twisted and then twisted together in the shape of a helix to form a bundle. In FIG. 10D, the wick structure 140i includes the wick fibers 1010 longitudinally extending and arranged side by side.

Figure 10K:
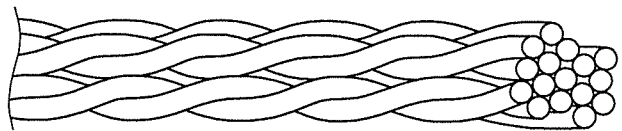
FIGS. 10H, 10J, and 10K illustrate different configurations of the wick structures of FIG. 10G.
Figure 10J:
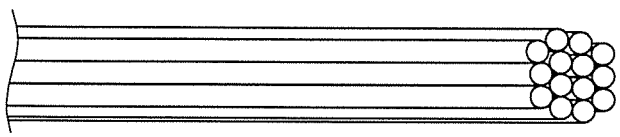
Figure 10H:
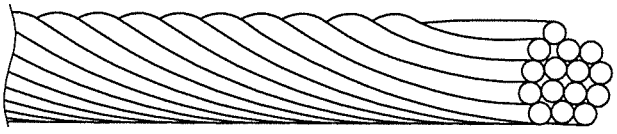
Figure 10G:
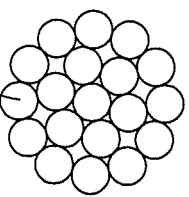
FIG. 10G is a cross-sectional view of a wick structure including multiple wick fibers, according to embodiments of the disclosure.
Figure 10F:
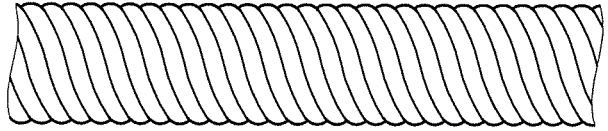

In FIGS. 10E and 10F, the wick structures 140j and 140k are formed by twisting the wick fibers 1010 in the shape of a helix to form a bundle. Due to the difference in the angle of twist of the wires in the wick structures 140j and 140k, the two wick structures 140j and 140k have a different tensile force.

In some other embodiments, the central wick fiber 1020 is absent in the wick structures 140g, 140h, 140i, 140j, and 140k.

FIG. 10G is a cross-sectional view of a wick structure including a plurality of wick fibers 1030 arranged in a circular manner. In an embodiment, the wick fibers 1030 include copper. However, the wick fibers 1030 can include other materials that facilitate the flow of condensed fluid by capillary force through the wick structure formed using the wick fibers 1030.

FIG. 10H illustrates a wick structure 140m in which the plurality of wick fibers 1030 are loosely twisted together. FIG. 10J illustrates a wick structure 140n in which the plurality of wick fibers 1030 are longitudinally arranged. FIG. 10K illustrates a wick structure 140p in which the plurality of wick fibers 1030 are twisted together or in pairs to form a braided structure. In some other embodiments, the wick fibers 1010, 1020, and/or 1030 are flattened.

The shape of the wick structures (e.g., 140, 141a, 142a, 143a, 140c, 150c, 140d, 150d, 141e, 142e, 141f, 141h, 142f, 170, and 180) is not limited to any particular shape. In some embodiments, the wick structures may be in a zig-zag shape or any other desired shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A heat dissipation device, comprising:
   a first casing;
   a second casing coupled to the first casing, the second casing including:
      a body having,
         an inner surface and an outer surface opposite the inner surface,
         a first portion and a second portion, wherein the second portion extends laterally from the first portion, the first portion and the second portion are formed by a same first outer edge, the first outer edge is a peripheral joint between the first casing and the second casing, and the first portion has a larger cross-sectional area than the second portion, and
      a plurality of columns formed on the inner surface and extending from the inner surface; and
   a first wick structure disposed on the inner surface of the second casing and in the first portion and the second portion, wherein
   the first wick structure is located in gaps between the plurality of columns and contacts the inner surface of the second casing,
   the first wick structure includes a first longitudinally extending portion and a second longitudinally extending portion, the first wick structure has a bend at location where the first longitudinally extending portion and the second longitudinally extending portion connect,
   the bend is located in the first portion,
   the first longitudinally extending portion is located proximate a second outer edge of the heat dissipation device, wherein the second outer edge is located in the second portion, the first longitudinally extending portion extends in the first portion and the second portion, the second outer edge is the peripheral joint between the first casing and the second casing,
   the second longitudinally extending portion is connected to an end of the first longitudinally extending portion and extends therefrom in the first portion, and
   the second longitudinally extending portion extends away from a third outer edge of the heat dissipation device, wherein
      the third outer edge is located in the first portion, is connected to the second outer edge, and is transverse to the second outer edge, the third outer edge being the peripheral joint between the first casing and the second casing,
      a distance between the third outer edge and the second longitudinally extending portion increases as the second longitudinally extending portion extends away from the bend, and
      an angle between the first longitudinally extending portion and the second longitudinally extending portion is greater than 90° and less than 180°.

2. The heat dissipation device of claim 1, further comprising:
   a second wick structure disposed on the inner surface and in the first portion and the second portion.

3. The heat dissipation device of claim 2, wherein the first and second wick structures have different lengths.

4. The heat dissipation device of claim 2, wherein the first and second wick structures contact each other along longitudinal edges thereof.

5. The heat dissipation device of claim 2, wherein the first and second wick structures are spaced from a heat source located on the outer surface of the second casing.

6. The heat dissipation device of claim 2, further comprising:
   a third wick structure disposed on the inner surface and in the first portion.

7. The heat dissipation device of claim 6, wherein the first, second, and third wick structures have different lengths.

8. The heat dissipation device of claim 6, wherein the first and second wick structures are spaced from a heat source outer surface of the first casing, and
   the third wick structure is aligned with the heat source.

9. The heat dissipation device of claim 1, wherein at least a portion of the first wick structure at least partially overlaps a heat source outer surface of the first casing.

* * * * *